United States Patent
Patil et al.

(10) Patent No.: US 11,502,049 B2
(45) Date of Patent: Nov. 15, 2022

(54) PACKAGE COMPRISING MULTI-LEVEL VERTICALLY STACKED REDISTRIBUTION PORTIONS

(71) Applicant: QUALCOMM Incorporated, San Diego, CA (US)

(72) Inventors: Aniket Patil, San Diego, CA (US); David Fraser Rae, San Diego, CA (US); Hong Bok We, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 72 days.

(21) Appl. No.: 16/868,349

(22) Filed: May 6, 2020

(65) Prior Publication Data

US 2021/0351145 A1 Nov. 11, 2021

(51) Int. Cl.
*H01L 23/00* (2006.01)
*H01L 23/31* (2006.01)
*H01L 21/56* (2006.01)

(52) U.S. Cl.
CPC .............. *H01L 24/05* (2013.01); *H01L 21/56* (2013.01); *H01L 23/3192* (2013.01); *H01L 24/03* (2013.01); *H01L 2224/02331* (2013.01)

(58) Field of Classification Search
CPC ..... H01L 24/05; H01L 21/56; H01L 23/3192; H01L 24/03; H01L 2224/02331
See application file for complete search history.

(56) References Cited

U.S. PATENT DOCUMENTS

| | | | |
|---|---|---|---|
| 7,932,615 B2 | 4/2011 | Rinne | |
| 9,330,994 B2 | 5/2016 | Camacho et al. | |
| 10,269,750 B2 | 4/2019 | Tu et al. | |
| 2017/0040266 A1* | 2/2017 | Lin | H01L 23/5383 |
| 2019/0273060 A1 | 9/2019 | Gu et al. | |
| 2021/0249372 A1* | 8/2021 | Hsu | H01L 24/03 |

FOREIGN PATENT DOCUMENTS

WO 2015138359 A1 9/2015

* cited by examiner

*Primary Examiner* — Thanh T Nguyen
(74) *Attorney, Agent, or Firm* — Loza & Loza, LLP/Qualcomm

(57) ABSTRACT

A package that includes a first redistribution portion, a second redistribution portion, a third redistribution portion, a first encapsulation layer coupled to the first redistribution portion and the third redistribution portion, a first discrete device encapsulated by the first encapsulation layer, wherein the first discrete device is located between the first redistribution portion and the third redistribution portion, a second encapsulation layer coupled to the first redistribution portion and the second redistribution portion, and a second discrete device encapsulated by the second encapsulation layer, wherein the second discrete device is located between the first redistribution portion and the second redistribution portion.

22 Claims, 32 Drawing Sheets

PROFILE VIEW

PROFILE VIEW

PROFILE VIEW

PROFILE VIEW

PROFILE VIEW

PROFILE VIEW

PROFILE VIEW

PROFILE VIEW

PACKAGE COMPRISING MULTI-LEVEL VERTICALLY STACKED REDISTRIBUTION PORTIONS

FIELD

Various features relate to packages that include an integrated device, but more specifically to a package that includes multiple redistribution portions.

BACKGROUND

FIG. 1 illustrates a package 100 that includes a substrate 102, an integrated device 104, a passive device 112, a passive device 114, and an encapsulation layer 108. The substrate 102 includes at least one dielectric layer 120, a plurality of interconnects 122, and a plurality of solder interconnects 124. A plurality of solder interconnects 144 are coupled to the substrate 102 and the integrated device 104. The encapsulation layer 108 encapsulates the integrated device 104, the passive device 112, the passive device 114, and the plurality of solder interconnects 144. The package 100 may also include a substrate 106. The substrate 106 includes at least one dielectric layer 160, a plurality of interconnects 162 and a plurality of solder interconnects 164. The substrate 106 may be coupled to the substrate 102 through the plurality of solder interconnects 124. A package that includes the substrate 102 and the substrate 106 may be limited by how compact and thin it can be. There is an ongoing need to provide thinner and more compact packages.

SUMMARY

Various features relate to packages that include an integrated device, but more specifically to a package that includes multiple redistribution portions.

One example provides a package that includes a first redistribution portion, a second redistribution portion, a third redistribution portion, a first encapsulation layer coupled to the first redistribution portion and the third redistribution portion, a first discrete device encapsulated by the first encapsulation layer, wherein the first discrete device is located between the first redistribution portion and the third redistribution portion, a second encapsulation layer coupled to the first redistribution portion and the second redistribution portion, and a second discrete device encapsulated by the second encapsulation layer, wherein the second discrete device is located between the first redistribution portion and the second redistribution portion.

Another example provides an apparatus that includes means for first redistribution, means for second redistribution, means for third redistribution, means for first encapsulation coupled to the means for first redistribution and the means for third redistribution, a first discrete device encapsulated by the means for first encapsulation, wherein the first discrete device is located between the means for first redistribution and the means for third redistribution, means for second encapsulation coupled to the means for first redistribution and the means for second redistribution, and a second discrete device encapsulated by the means for second encapsulation, wherein the second discrete device is located between the means for first redistribution and the means for second redistribution.

Another example provides a method for fabricating a package. The method provides a first discrete device. The method forms a first encapsulation layer over the first discrete device. The method forms a first redistribution portion over a first side of the first encapsulation layer. The method couples a second discrete device to the first redistribution portion. The method forms a second encapsulation layer over the second discrete device. The method forms a second redistribution portion over the second encapsulation layer. The method forms a third redistribution portion over a second side of the first encapsulation layer.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a first redistribution portion, a second redistribution portion, a third redistribution portion, a first encapsulation layer coupled to the first redistribution portion and the third redistribution portion, a first discrete device encapsulated by the first encapsulation layer, wherein the first discrete device is located between the first redistribution portion and the third redistribution portion, a second encapsulation layer coupled to the first redistribution portion and the second redistribution portion, and a second discrete device encapsulated by the second encapsulation layer, wherein the second discrete device is located between the first redistribution portion and the second redistribution portion. A redistribution portion has a thickness that is thinner than package substrates, which allows the package to be thinner and have a more compact form factor. Moreover, the thinner redistribution portion, provide shorter paths for electrical currents between discrete devices (e.g., integrated devices, passive devices), which may help improve the performance of the package. In addition, embedding at least one discrete device in an encapsulation layer may help improve the structural stability of the package and/or reduce warpage of the package.

Exemplary Package Comprising Multiple Redistribution Portions

Figure 1:
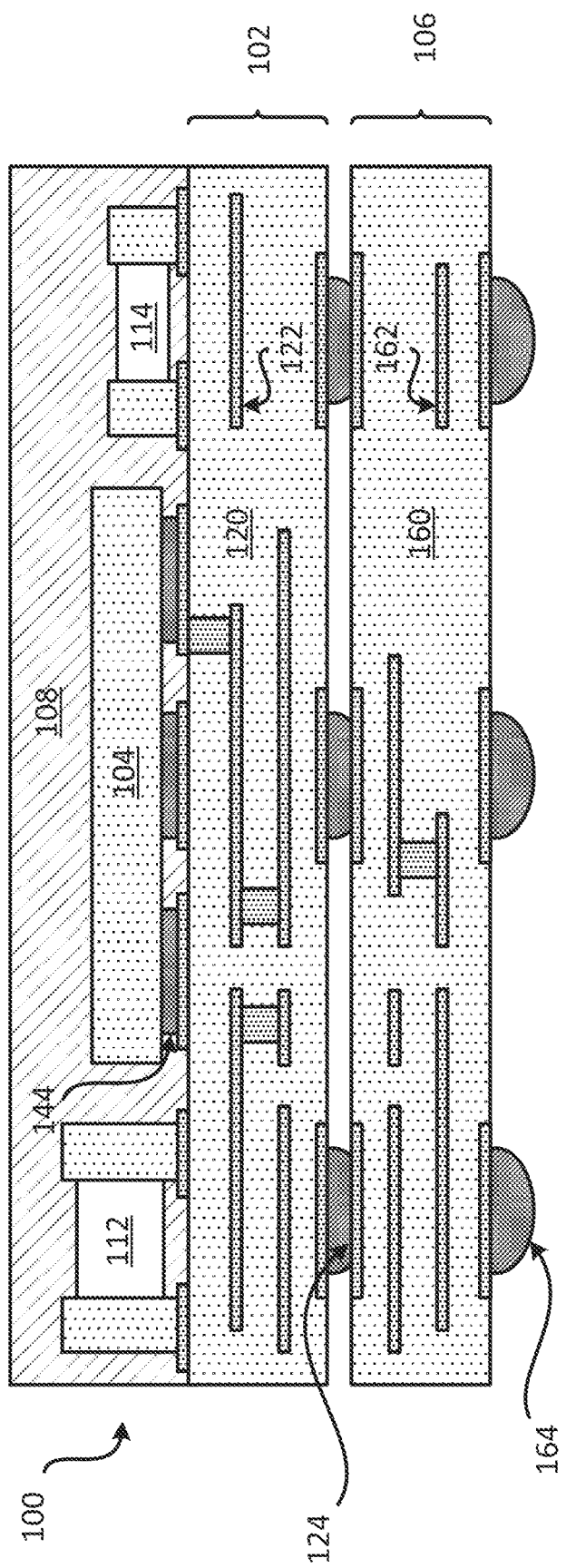
FIG. 1 illustrates a profile view of a package that includes an integrated device and a substrate.
Figure 2:
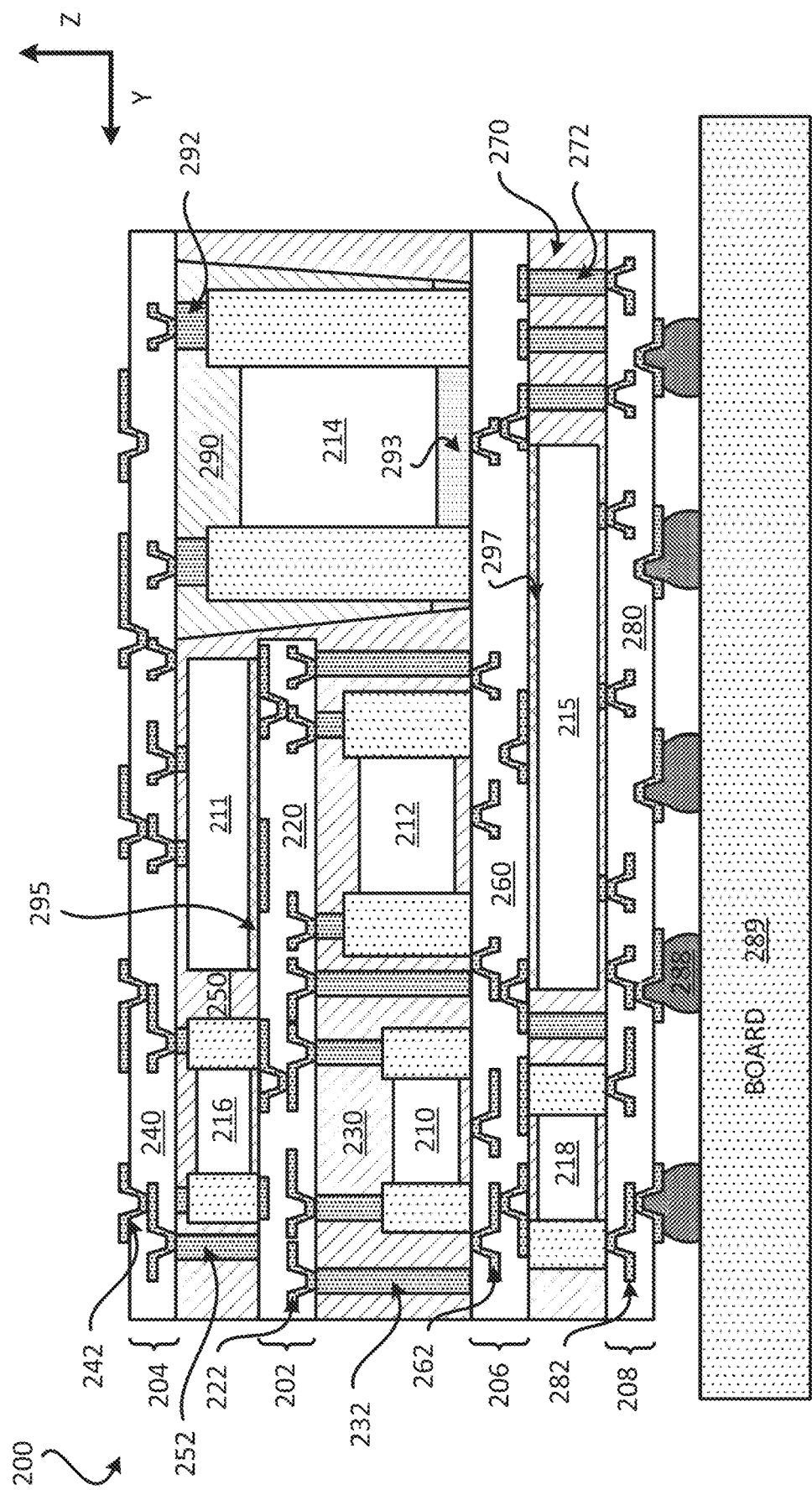
FIG. 2 illustrates a profile view of a package that includes multiple redistribution portions.

FIG. 2 illustrates a profile view of a package 200 that includes multiple redistribution portions. The package 200 is coupled to a board 289 (e.g., printed circuit board (PCB)) through a plurality of solder interconnects 288. The package 200 may include a System in Package (SiP) comprising multi-level vertically stacked redistribution portions.

As shown in FIG. 2, the package 200 includes a redistribution portion 202, a redistribution portion 204, a redistribution portion 206, a redistribution portion 208, an integrated device 211, an integrated device 215, a passive device 210, a passive device 212, a passive device 214, a passive device 216, a passive device 218, an encapsulation layer 230, an encapsulation layer 250, an encapsulation layer 270, and an encapsulation layer 270. The integrated devices (e.g., 211, 215) and the passive devices (e.g., 210, 212, 214, 216, 218) may be examples of discrete devices. A passive device may include a capacitor. The discrete devices may have different sizes and/or shapes.

In some implementations, the redistribution portion 202 may be a first redistribution portion, the redistribution portion 204 may be a second redistribution portion, the redistribution portion 206 may be a third redistribution portion, and the redistribution portion 208 may be a fourth redistribution portion. However, any of the redistribution portions (e.g., 202, 204, 206, 208) may be considered, the first redistribution portion, the second redistribution portion, the third redistribution portion, and/or the fourth redistribution portion. A redistribution portion may be means for redistribution (e.g., means for first redistribution, means for second redistribution, means for third redistribution, means for fourth redistribution).

The redistribution portion 202 (e.g., first redistribution portion) includes at least one dielectric layer 220 (e.g., first dielectric layer) and a plurality of redistribution interconnects 222 (e.g., first plurality of redistribution interconnects). The redistribution portion 204 (e.g., second redistribution portion) includes at least one dielectric layer 240 (e.g., second dielectric layer) and a plurality of redistribution interconnects 242 (e.g., second plurality of redistribution interconnects). The redistribution portion 206 (e.g., third redistribution portion) includes at least one dielectric layer 260 (e.g., third dielectric layer) and a plurality of redistribution interconnects 262 (e.g., third plurality of redistribution interconnects). The redistribution portion 208 (e.g., fourth redistribution portion) includes at least one dielectric layer 280 (e.g., fourth dielectric layer) and a plurality of redistribution interconnects 282 (e.g., fourth plurality of redistribution interconnects). The plurality of redistribution interconnects (e.g., 222, 242, 262, 282) may include a U-shape interconnect and/or V-shape interconnect. The terms "U-shape" and "V-shape" shall be interchangeable. The terms "U-shape" and "V-shape" may refer to the side profile shape of the interconnects and/or redistribution interconnects. The U-shape interconnect and the V-shape interconnect may have a top portion and a bottom portion. A redistribution portion may include at least one redistribution layer. Different redistribution portions may have different numbers of redistribution layers.

FIG. 2 illustrates that the encapsulation layer 230 (e.g., first encapsulation layer) is coupled to the redistribution portion 202 (e.g., first redistribution portion) and the redistribution portion 206 (e.g., third redistribution portion). At least one first discrete device (e.g., passive device 210 and/or 212) is encapsulated by the encapsulation layer 230. The at least one first discrete device and the encapsulation layer 230 are located between the redistribution portion 202 and the redistribution portion 206. The encapsulation layer 250 (e.g., second encapsulation layer) is coupled to the redistribution portion 202 and the redistribution portion 204 (e.g., second redistribution portion). At least one second discrete device (e.g., integrated device 211, passive device 216) is encapsulated by the encapsulation layer 250. The at least one second discrete device and the encapsulation layer 250 are located between the redistribution portion 202 and the redistribution portion 204.

The integrated device 211 may be coupled to the redistribution portion 202 through an adhesive 295. The back side of the integrated device 211 may face the redistribution portion 202, and the front side of the integrated device 211 may face the redistribution portion 204. The integrated device 215 may be coupled to the redistribution portion 206 through an adhesive 297. The back side of the integrated device 215 may face the redistribution portion 206, and the front side of the integrated device 215 may face the redistribution portion 208.

FIG. 2 illustrates that the encapsulation layer 270 (e.g., third encapsulation layer) is coupled to the redistribution portion 206 (e.g., third redistribution portion) and the redistribution portion 208 (e.g., fourth redistribution portion). At least one third discrete device (e.g., passive device 218, integrated device 215) is encapsulated by the encapsulation layer 270 (e.g., third encapsulation layer). The at least one third discrete device and the encapsulation layer 270 are located between the redistribution portion 206 (e.g., third redistribution portion) and the redistribution portion 208 (e.g., fourth redistribution portion). The plurality of solder interconnects 288 is coupled to the redistribution portion 208. More specifically, the plurality of solder interconnects 288 is coupled to the plurality of redistribution interconnects 282.

At least one discrete device (e.g., third discrete device, fourth discrete device, passive device 214) is encapsulated by at least one encapsulation layer (e.g., 230, 250, and/or 290). It is noted that in some implementations, the encapsulation layer 230, the encapsulation layer 250 and/or the encapsulation layer 290 may be considered part of the same encapsulation layer. The at least one discrete device is located between the redistribution portion 204 (e.g., second redistribution portion) and the redistribution portion 206 (e.g., third redistribution portion). The at least one discrete device, such as the passive device 214, is located laterally to the redistribution portion 202 (e.g., first redistribution portion). The passive device 214 may be coupled to the redistribution portion 206 through an adhesive 293.

The package 200 also includes a plurality of pillars 232, a plurality of pillars 252, a plurality of pillars 272 and a plurality of pillars 292. A pillar may be an interconnect that travels vertically through a dielectric layer and/or an encapsulation layer. A vertical direction may be along a Z-direction. A vertical direction may be a direction between two redistribution portions. The plurality of pillars 232 is located in the encapsulation layer 230. The plurality of pillars 252 is located in the encapsulation layer 250. The plurality of pillars 272 is located in the encapsulation layer 270. The plurality of pillars 292 may be located in the encapsulation layers 230, 250 and/or 290. The pillars may have a variety of height. Some pillars may travel through the entire thickness of an encapsulation layer. Some pillars may be located between a discrete device (e.g., integrated device, passive device) and a redistribution portion. Different pillars may have different thicknesses, widths and/or diameters.

The plurality of pillars 232 may be coupled to the passive device 210, the passive device 212, the redistribution portion 202 and/or the redistribution portion 206. For example, the plurality of pillars 232 may be coupled to the plurality of redistribution interconnects 222 and/or the plurality of redistribution interconnects 262. The plurality of pillars 252 may be coupled to the passive device 216, the integrated device 211, the redistribution portion 202 and/or the redistribution portion 204. For example, the plurality of pillars 252 may be coupled to the plurality of redistribution interconnects 222 and/or the plurality of redistribution interconnects 242. The plurality of pillars 272 may be coupled to the passive device 218, the integrated device 215, the redistribution portion 206 and/or the redistribution portion 208. For example, the plurality of pillars 272 may be coupled to the plurality of redistribution interconnects 262 and/or the plurality of redistribution interconnects 282. The plurality of pillars 292 may be coupled to the passive device 214, the redistribution portion 204 and/or the redistribution portion 206. For example, the plurality of pillars 292 may be coupled to the plurality of redistribution interconnects 242. A pillar may be considered as a through mold vias (TMV).

The various discrete devices (e.g., passive device(s), integrated device(s)) may be configured to be electrically coupled to each other through various interconnects (e.g., redistribution interconnects, pillars) of the package 200.

The encapsulation layers (e.g., 230, 250, 270, 290) may include a mold, a resin, an epoxy and/or polymer. An encapsulation layer may be means for encapsulation (e.g., means for first encapsulation, means for second encapsulation, means for third encapsulation, means for fourth encapsulation). Although FIG. 2 (and other figures in the disclosure) illustrate the encapsulation layers 230, 250 and 290 as separate encapsulation layers, in some implementations, two or more of the encapsulation layers (e.g., 230, 250 and 290) may be considered as being the same encapsulation layer and/or a single encapsulation layer.

As mentioned above, a redistribution portion may include at least one dielectric layer and a plurality of redistribution interconnects. The at least one dielectric layer may include a polymer. A redistribution interconnect may have a minimum pitch and a minimum line and spacing (L/S). In some implementations, the minimum pitch for a plurality of redistribution interconnects (e.g., 222, 242, 262, 282) is in a range of approximately 100-200 micrometers (μm). In some implementations, the minimum line and spacing (L/S) for the plurality of redistribution interconnects (e.g., 222, 242, 262, 282) is in a range of approximately 5/5-20/20 micrometers (μm). A redistribution portion may be thinner than other substrates that have the same number of metal layers.

The thinner redistribution portions (e.g., 202, 204, 206, 208) allow the package 200 to be thinner and more compact than other packages that include substrates formed using non-redistribution layers fabrication processes. As an example, when a redistribution layer (RDL) fabrication process is used to fabricate the redistribution portion (e.g., 202), the thickness of each of the redistribution metal layers (on which redistribution interconnects 222 are formed) may be approximately 5-10 micrometers (μm). In contrast, interconnects for substrates that are fabricated using Semi-Additive Processing (SAP) or modified Semi Additive Processing (mSAP) for example, have a thickness that is approximately 15 micrometers (μm).

The dielectric layer of a redistribution portion (e.g., 202, 204, 206, 208) may be considered as one dielectric layer. However, in some implementations, as will be further described below, the process of forming the dielectric layer for a redistribution portion may include forming several dielectric layers over one another. In some implementations, when a redistribution layer (RDL) fabrication process is used, each dielectric layer may have a thickness that is approximately 5-10 micrometers (μm). In contrast, when SAP or mSAP is used to form the dielectric layers of a substrate, each dielectric layer of the substrate is approximately 20-25 micrometers (μm).

In addition to a smaller form factor for the package 200, the redistribution portions allow for a more optimal use of the space in the package 200, as well as more flexibility in where components and devices can be placed in the package 200. For example, different redistribution portions may have different lateral dimensions. For the example, the redistribution portion 202 may have a smaller lateral dimension (e.g., along X and/or Y dimensions) than the lateral dimensions of the redistribution portions 204, 206 and/or 208. Moreover, the shorter distances between integrated devices and/or passive devices means less parasitic losses between integrated devices and/or passive devices, which may help improve the performance of the package 200.

FIG. 2 illustrates that the entire region between the redistribution portion 204 and the redistribution portion 208 may be free of a solder interconnect. For example, an entire region between the redistribution portion 204 and the redistribution portion 202 may be free of a solder interconnect, an entire region between the redistribution portion 202 and the redistribution portion 206 may be free of a solder interconnect, and/or an entire region between the redistribution portion 206 and the redistribution portion 208 may be free of a solder interconnect. Reducing and/or eliminating solder interconnects between the redistribution portion 204 and the redistribution portion 208 helps reduce the overall thickness of the package 200 and may also reduce the overall cost of the package 200.

Figure 3:
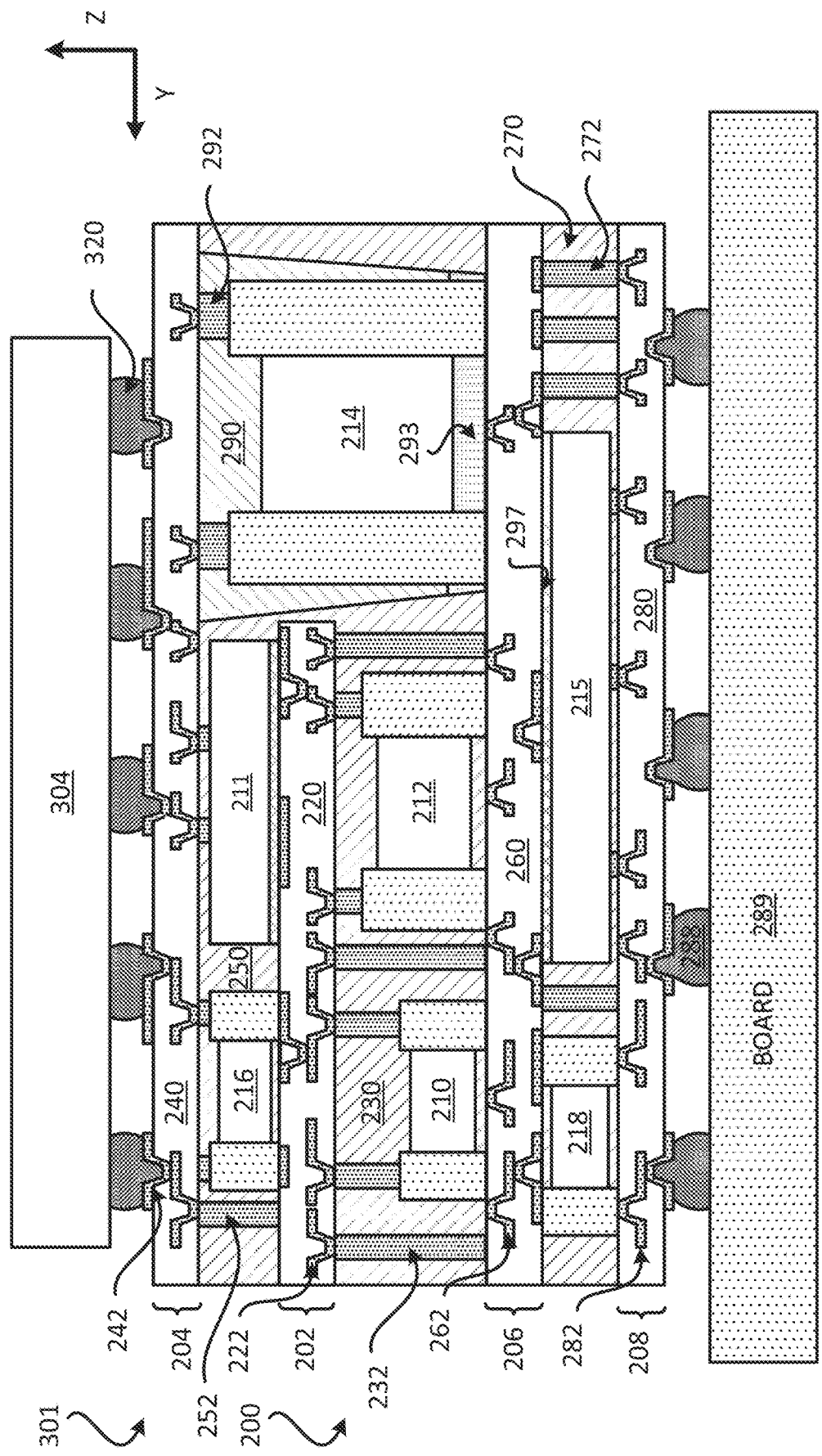
FIG. 3 illustrates a profile view of a package on package (PoP) with a package that includes multiple redistribution portions.

FIG. 3 illustrates the package 200 implemented with a package on package (PoP) 301. As shown in FIG. 3, the PoP 301 includes the package 200 and a package 304. The package 200 may be a bottom package and the package 304 may be a top package. The package 304 is coupled to the package 200 through a plurality of solder interconnects 320. Different implementations may use different packages. The package 304 may include an integrated device. The package 304 may include at least one substate and/or a redistribution portion. The package 304 may include a wafer level package (WLP). The package 304 may be coupled to the redistribution portion 204 through the plurality of solder interconnects 320. In particular, the package 304 may be coupled to the plurality of redistribution interconnects 242 through the plurality of solder interconnects 320.

Figure 4:
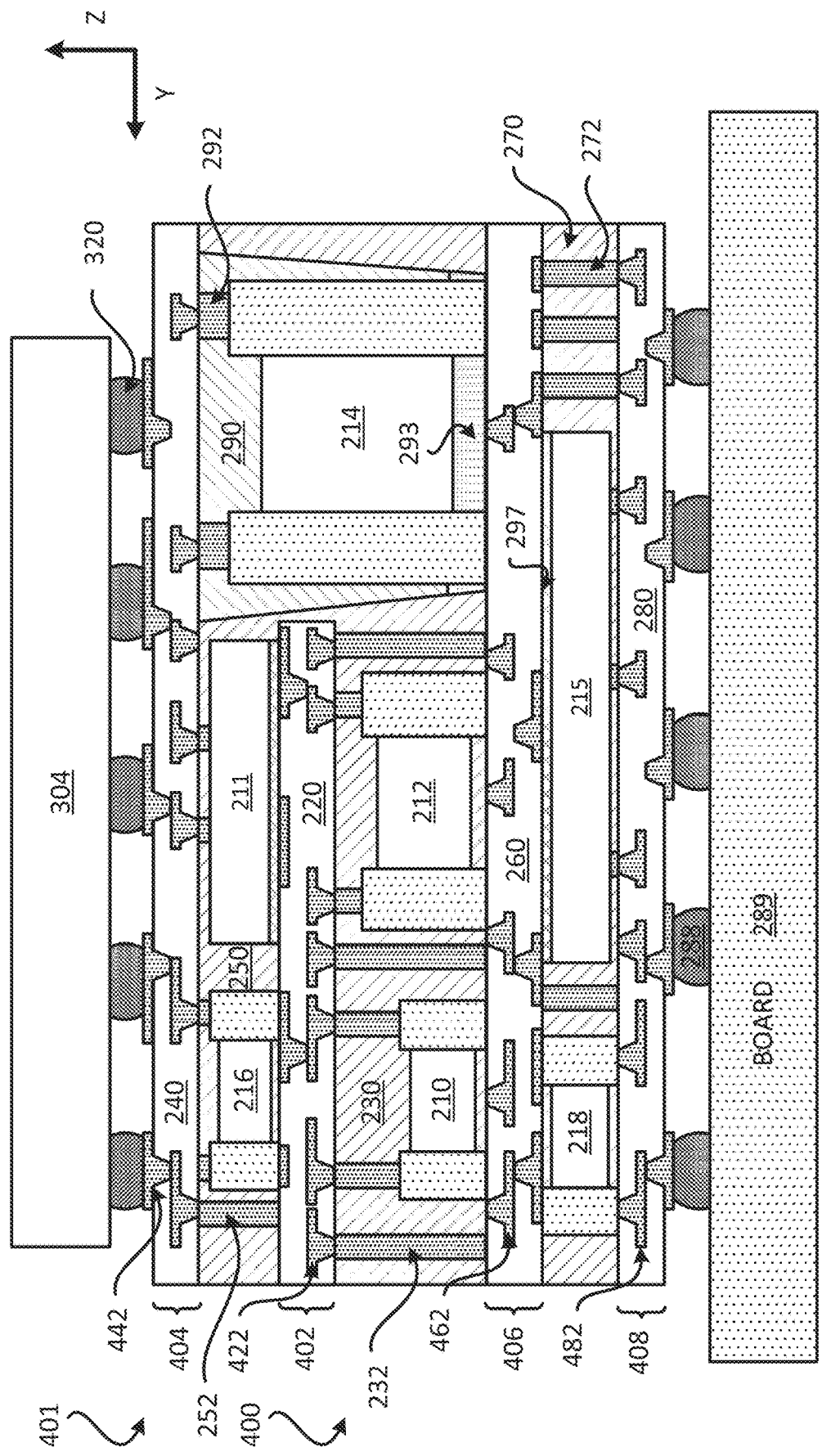
FIG. 4 illustrates a profile view of a package on package (PoP) with a package that includes multiple redistribution portions.

FIG. 4 illustrates another example of a PoP 401 that includes a package comprising multiple redistribution portions. As shown in FIG. 4, the PoP 401 includes a package 400 and the package 304. The package 304 is coupled to the package 400 through the plurality of solder interconnects 320. The package 400 is similar to the package 200, as described in FIG. 2 and FIG. 3, and thus the package 400 includes similar components as the package 200, and may be arranged and configured to operate in a similar manner as the package 200. However, as will be further described below, the package 400 includes at least one redistribution portion that comprises interconnects (e.g., redistribution interconnects) that have a different shape than the redistribution interconnects described in the package 200.

The package 400 includes a redistribution portion 402, a redistribution portion 404, a redistribution portion 406, a redistribution portion 408, the integrated device 211, the integrated device 215, the passive device 210, the passive device 212, the passive device 214, the passive device 216, the passive device 218, the encapsulation layer 230, the encapsulation layer 250, the encapsulation layer 270, and the encapsulation layer 290.

The redistribution portion 402 (e.g., first redistribution portion) includes at least one dielectric layer 220 (e.g., first dielectric layer) and a plurality of redistribution interconnects 422 (e.g., first plurality of redistribution interconnects). The redistribution portion 404 (e.g., second redistribution portion) includes at least one dielectric layer 240 (e.g., second dielectric layer) and a plurality of redistribution interconnects 442 (e.g., second plurality of redistribution interconnects). The redistribution portion 406 (e.g., third redistribution portion) includes at least one dielectric layer 260 (e.g., third dielectric layer) and a plurality of redistribution interconnects 462 (e.g., third plurality of redistribution interconnects). The redistribution portion 408 (e.g., fourth redistribution portion) includes at least one dielectric layer 280 (e.g., fourth dielectric layer) and a plurality of redistribution interconnects 482 (e.g., fourth plurality of redistribution interconnects). The plurality of redistribution interconnects (e.g., 422, 442, 462, 482) may have a different shape than the plurality of redistribution interconnects (e.g., 222, 242, 262, 282). The different shapes may be the result of a different fabrication process used. A redistribution interconnect (e.g., 422, 442, 462, 482) may include a via, a trace and/or a pad.

Figure 5:
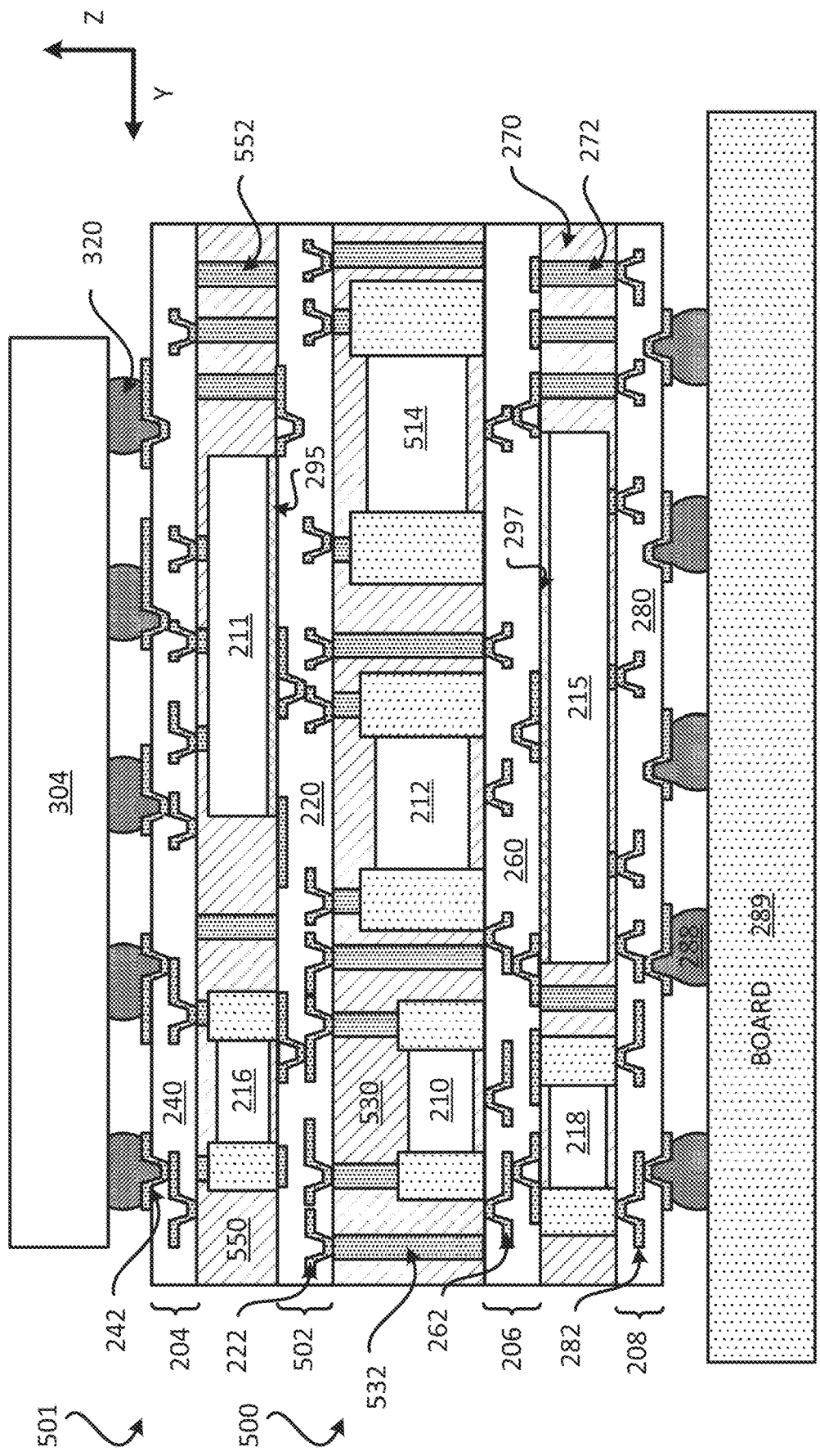
FIG. 5 illustrates a profile view of a package on package (PoP) with a package that includes multiple redistribution portions.

FIG. 5 illustrate a package on package (PoP) 501 that includes a package 500 and the package 304. The package 304 is coupled to the package 500 through the plurality of solder interconnects 320. The package 500 is similar to the package 200, as described in FIG. 2, and thus the package 500 includes similar components as the package 200, and may be arranged and configured to operate in a similar manner as the package 200.

The package 500 includes a redistribution portion 502, the redistribution portion 204, the redistribution portion 206, the redistribution portion 208, the integrated device 211, the integrated device 215, the passive device 210, the passive device 212, the passive device 514, the passive device 216, the passive device 218, the encapsulation layer 530, the encapsulation layer 550, and the encapsulation layer 270.

The redistribution portion 502 includes at least one dielectric layer 220 and the plurality of redistribution interconnects 222. The redistribution portion 204 includes at least one dielectric layer 240 and the plurality of redistribution interconnects 242. The redistribution portion 206 includes at least one dielectric layer 260 and the plurality of redistribution interconnects 262. The redistribution portion 208 includes at least one dielectric layer 280 and the plurality of redistribution interconnects 282. The plurality of redistribution interconnects (e.g., 222, 242, 262, 282) may include a U-shape interconnect and/or V-shape interconnect.

The encapsulation layer 530 (e.g., first encapsulation layer) is coupled to the redistribution portion 502 and the redistribution portion 206. At least one first discrete device (e.g., passive device 210, 212 and/or 514) is encapsulated by the encapsulation layer 530. The at least one first discrete device and the encapsulation layer 530 are located between the redistribution portion 502 and the redistribution portion 206. The encapsulation layer 550 (e.g., second encapsulation layer) is coupled to the redistribution portion 502 and the redistribution portion 204. At least one second discrete device (e.g., integrated device 211, passive device 216) is encapsulated by the encapsulation layer 550. The at least one second discrete device and the encapsulation layer 550 are located between the redistribution portion 502 and the redistribution portion 204.

The integrated device 211 may be coupled to the redistribution portion 502 through an adhesive 295. The back side of the integrated device 211 may face the redistribution portion 502, and the front side of the integrated device 211 may face the redistribution portion 204.

The package 500 also includes a plurality of pillars 532, the plurality of pillars 252, the plurality of pillars 272 and the plurality of pillars 292. The plurality of pillars 532 is located in the encapsulation layer 530. The pillars may have a variety of height. Some pillars may travel through the entire thickness of an encapsulation layer. Some pillars may be located between a discrete device and a redistribution portion. Different pillars may have different thicknesses, widths and/or diameters.

The plurality of pillars 532 may be coupled to the passive device 210, the passive device 212, the redistribution portion 502 and/or the redistribution portion 206. For example, the plurality of pillars 532 may be coupled to the plurality of redistribution interconnects 222 and/or the plurality of redistribution interconnects 262.

The various discrete devices (e.g., passive device(s), integrated device(s)) may be configured to be electrically coupled to each other through various interconnects (e.g., redistribution interconnects, pillars) of the package 500.

Figure 6:
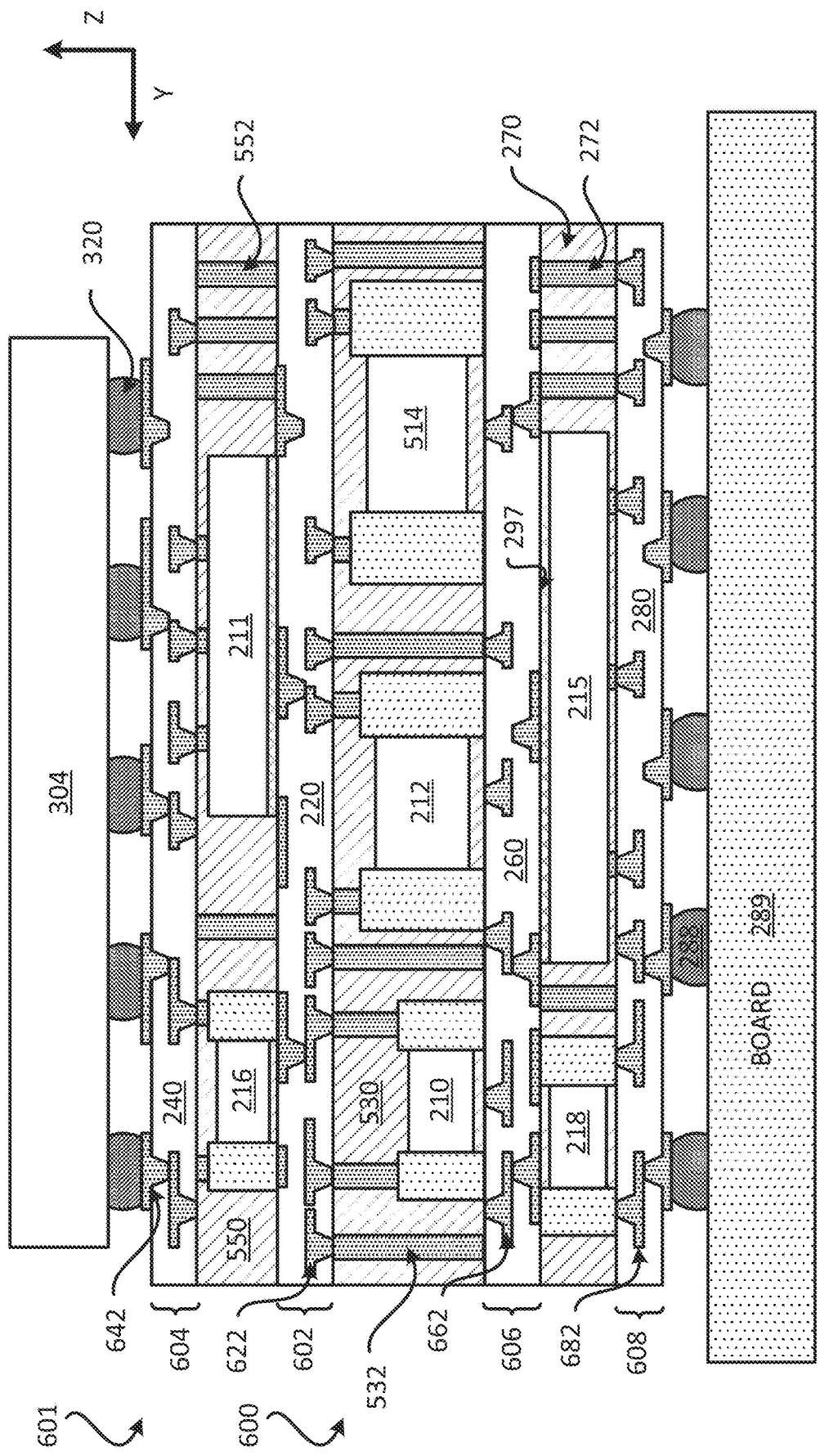
FIG. 6 illustrates a profile view of a package on package (PoP) with a package that includes multiple redistribution portions.

FIG. 6 illustrates another example of a PoP 601 that includes a package comprising multiple redistribution portions. As shown in FIG. 6, the PoP 601 includes a package 600 and the package 304. The package 304 is coupled to the package 600 through the plurality of solder interconnects 320. The package 600 is similar to the package 500, as described in FIG. 5, and thus the package 600 includes similar components as the package 500, and may be arranged and configured to operate in a similar manner as the package 500. However, as will be further described below, the package 600 includes at least one redistribution portion that comprises interconnects (e.g., redistribution interconnects) that have a different shape than the redistribution interconnects described in the package 500.

The package 600 includes a redistribution portion 602, a redistribution portion 604, a redistribution portion 606, a redistribution portion 608, the integrated device 211, the integrated device 215, the passive device 210, the passive device 212, the passive device 514, the passive device 216, the passive device 218, the encapsulation layer 530, the encapsulation layer 550, and the encapsulation layer 270.

The redistribution portion 602 (e.g., first redistribution portion) includes at least one dielectric layer 220 (e.g., first dielectric layer) and a plurality of redistribution interconnects 622 (e.g., first plurality of redistribution interconnects). The redistribution portion 604 (e.g., second redistribution portion) includes at least one dielectric layer 240 (e.g., second dielectric layer) and a plurality of redistribution interconnects 642 (e.g., second plurality of redistribution interconnects). The redistribution portion 606 (e.g., third redistribution portion) includes at least one dielectric layer 260 (e.g., third dielectric layer) and a plurality of redistribution interconnects 662 (e.g., third plurality of redistribution interconnects). The redistribution portion 608 (e.g., fourth redistribution portion) includes at least one dielectric layer 280 (e.g., fourth dielectric layer) and a plurality of redistribution interconnects 682 (e.g., fourth plurality of redistribution interconnects). The plurality of redistribution interconnects (e.g., 622, 642, 662, 682) may have a different shape than the plurality of redistribution interconnects (e.g., 222, 242, 262, 282) as described and illustrated in FIG. 5. The different shapes may be the result of a different fabrication process used. A redistribution interconnect may include a via, a trace and/or a pad.

Different implementations may have different numbers of redistribution portions. For example, some packages may have fewer than four (4) redistribution portions or more than four (4) redistribution portions.

Figure 7:
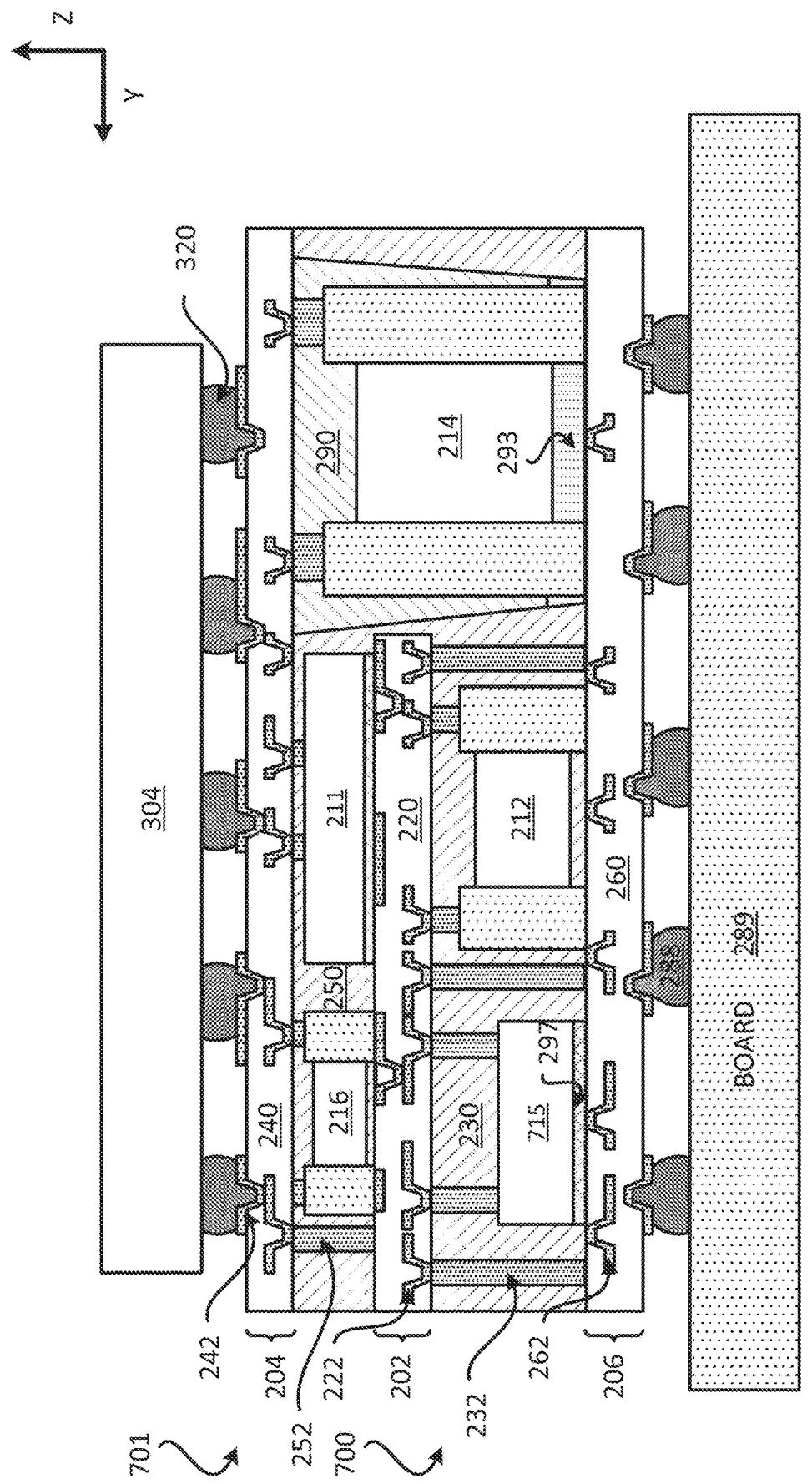
FIG. 7 illustrates a profile view of a package on package (PoP) with a package that includes multiple redistribution portions.
Figure 8:
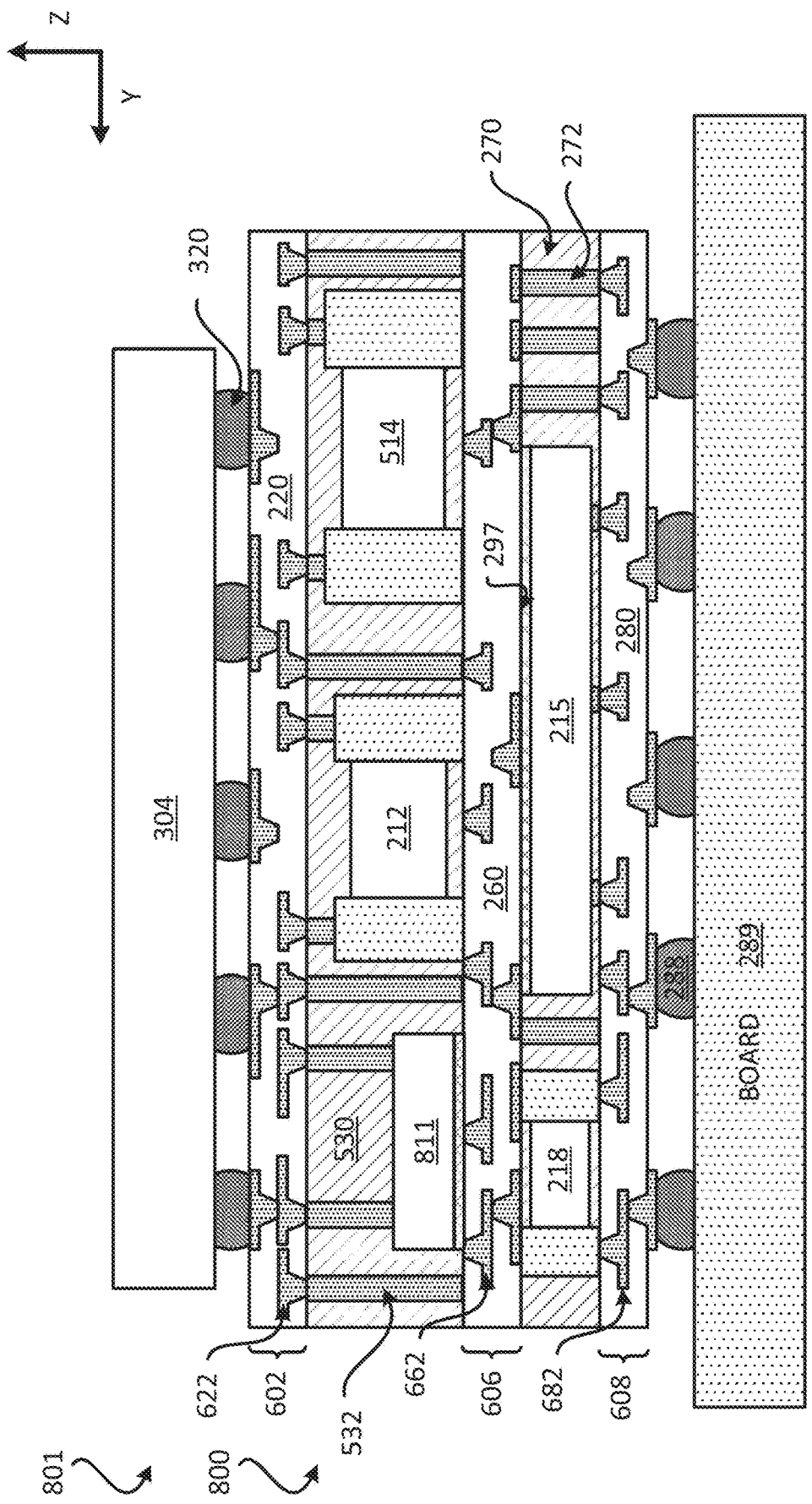
FIG. 8 illustrates a profile view of a package on package (PoP) with a package that includes multiple redistribution portions.

FIGS. 7 and 8 illustrate packages with fewer than four redistribution portions. FIG. 7 illustrates a package on package (PoP) 701 that includes a package 700 and the package 304. The package 304 is coupled to the package 700 through the plurality of solder interconnects 320. The package 700 is similar to the package 200, as described in FIG. 2, and thus the package 700 includes similar components as the package 200, and may be arranged and configured to operate in a similar manner as the package 200.

The package 700 includes the redistribution portion 202, the redistribution portion 204, the redistribution portion 206, the integrated device 211, the integrated device 715, the passive device 210, the passive device 212, the passive device 214, the encapsulation layer 230, the encapsulation layer 250, and the encapsulation layer 290. Although FIG. 7 illustrate the encapsulation layers 230, 250 and 290 as separate encapsulation layers, in some implementations, two or more of the encapsulation layers (e.g., 230, 250 and 290) may be considered as being the same encapsulation layer and/or a single encapsulation layer.

The package 700 may be different from the package 200 in that the package 700 does not include a redistribution portion 208 nor an encapsulation layer 270, as described for the package 200. The plurality of solder interconnects 288 may be coupled to the redistribution portion 206. For example, the plurality of solder interconnects 288 may be coupled to the plurality of redistribution interconnects 262.

FIG. 8 illustrates a package on package (PoP) 801 that includes a package 800 and the package 304. The package 304 is coupled to the package 800 through the plurality of solder interconnects 320. The package 800 is similar to the package 600, as described in at least FIG. 6, and thus the package 800 includes similar components as the package 600, and may be arranged and configured to operate in a similar manner as the package 600.

The package 800 includes the redistribution portion 602, the redistribution portion 606, the redistribution portion 608, the integrated device 211, the integrated device 215, the passive device 212, the passive device 514, the passive device 218, the encapsulation layer 530, and the encapsulation layer 270.

The package 800 may be different from the package 600 in that the package 800 does not include a redistribution portion 604 nor an encapsulation layer 550, as described for the package 600. The plurality of solder interconnects 320 may be coupled to the redistribution portion 604. For example, the plurality of solder interconnects 320 may be coupled to the plurality of redistribution interconnects 642.

FIGS. 2-8 illustrate that an entire region between a top redistribution portion (e.g., 204, redistribution portion farthest away from the board 289) and a bottom redistribution portion (e.g., 208, redistribution portion closest to the board 289) of a package may be free of a solder interconnect, which as mentioned above helps reduce the overall thickness of a package and may also reduce the overall cost of the package. It is noted that the structures and/or the packages shown in FIGS. 2-8 are merely examples of structures and/or packages where regions between top redistribution portion (e.g., 204) and a bottom redistribution portion (e.g., 208) of a package are free of solder interconnects. However, the various components of the packages may be arranged in many different configurations. As such, the features described in the disclosure shall not be interpreted in a limiting way.

The integrated device (e.g., 211, 215) may include a die (e.g., bare die). The integrated device may include a radio frequency (RF) device, a passive device, a filter, a capacitor, an inductor, an antenna, a transmitter, a receiver, a GaAs based integrated device, a surface acoustic wave (SAW) filters, a bulk acoustic wave (BAW) filter, a light emitting diode (LED) integrated device, a silicon carbide (SiC) based integrated device, memory, a processor and/or combinations thereof.

Different implementations may couple different components and/or different numbers of components to the redistribution portion. A redistribution portion may include at least one redistribution layer. Each redistribution portion may include different number of redistribution layers. Different implementations may use different interconnects to couple the package to a board 289.

Having described various packages with multiple redistribution portions, processes for fabricating a PoP comprising a package that includes a multiple redistribution portions will now be described below.

Exemplary Sequence for Fabricating a Package on Package (PoP) That Includes a Package Comprising Multiple Redistribution Portions FIGS. 9A-9M illustrate an exemplary sequence for providing or fabricating a PoP comprising a package that includes multiple redistribution portions. In some implementations, the sequence of FIGS. 9A-9M may be used to provide or fabricate the PoP 301 of FIG. 3, or any of the PoPs and/or packages described in the disclosure.

It should be noted that the sequence of FIGS. 9A-9M may combine one or more stages in order to simplify and/or clarify the sequence for providing or fabricating the PoP. In some implementations, the order of the processes may be changed or modified. In some implementations, one or more of processes may be replaced or substituted without departing from the spirit of the disclosure. Different implementations may fabricate a PoP differently. FIGS. 9A-9M may be used to fabricate a PoP and/or a package.

Figure 9A:
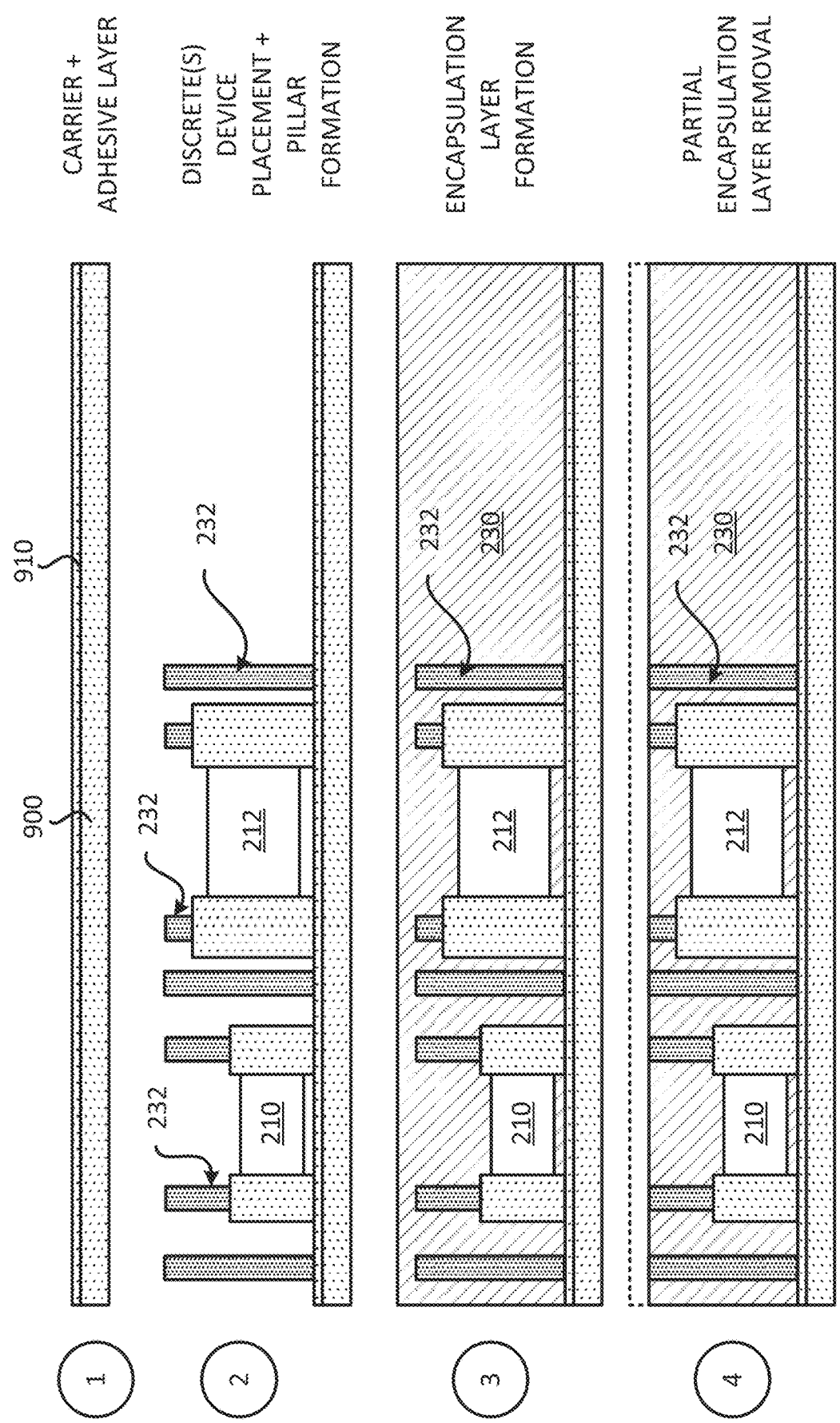
FIGS. 9A-9M illustrate an exemplary sequence for fabricating a package on package (PoP) with a package that includes multiple redistribution portions.

Stage 1, as shown in FIG. 9A, illustrates a state after a carrier 900 and an adhesive layer 910 are provided. The carrier 900 may be a substrate and/or a wafer. The carrier 900 may include glass and/or silicon. The carrier 900 may be a first carrier. The adhesive layer 910 may be disposed (e.g., formed) over the carrier 900. The adhesive layer 910 may be an adhesive film.

Stage 2 illustrates a state after (i) the passive device 210 and the passive device 212 are placed over the adhesive layer 910 and the carrier 900 and (ii) the plurality of pillars 232 are provided over the passive device 210, the passive device 212, the adhesive layer 910 and the carrier 900. A pick and place method may be used to place the passive device 210 and the passive device 212. Different implementations may place different discrete devices and/or different number of discrete devices over the adhesive layer 910 and the carrier 900. A plating process may be used to form the plurality of pillars 232.

Stage 3 illustrates a state after the encapsulation layer 230 is formed over the adhesive layer 910 and the carrier 900, such that the encapsulation layer 230 at least partially encapsulates the passive device 210, the passive device 212 and the plurality of pillars 232. The process of forming and/or disposing the encapsulation layer 230 may include using a compression and transfer molding process, a sheet molding process, or a liquid molding process.

Stage 4 illustrates a state after a portion of the encapsulation layer 230 is removed. A grinding process may be used to remove a portion of the encapsulation layer 230. The grinding process may also remove portions of the plurality of pillars 232.

Figure 9B:
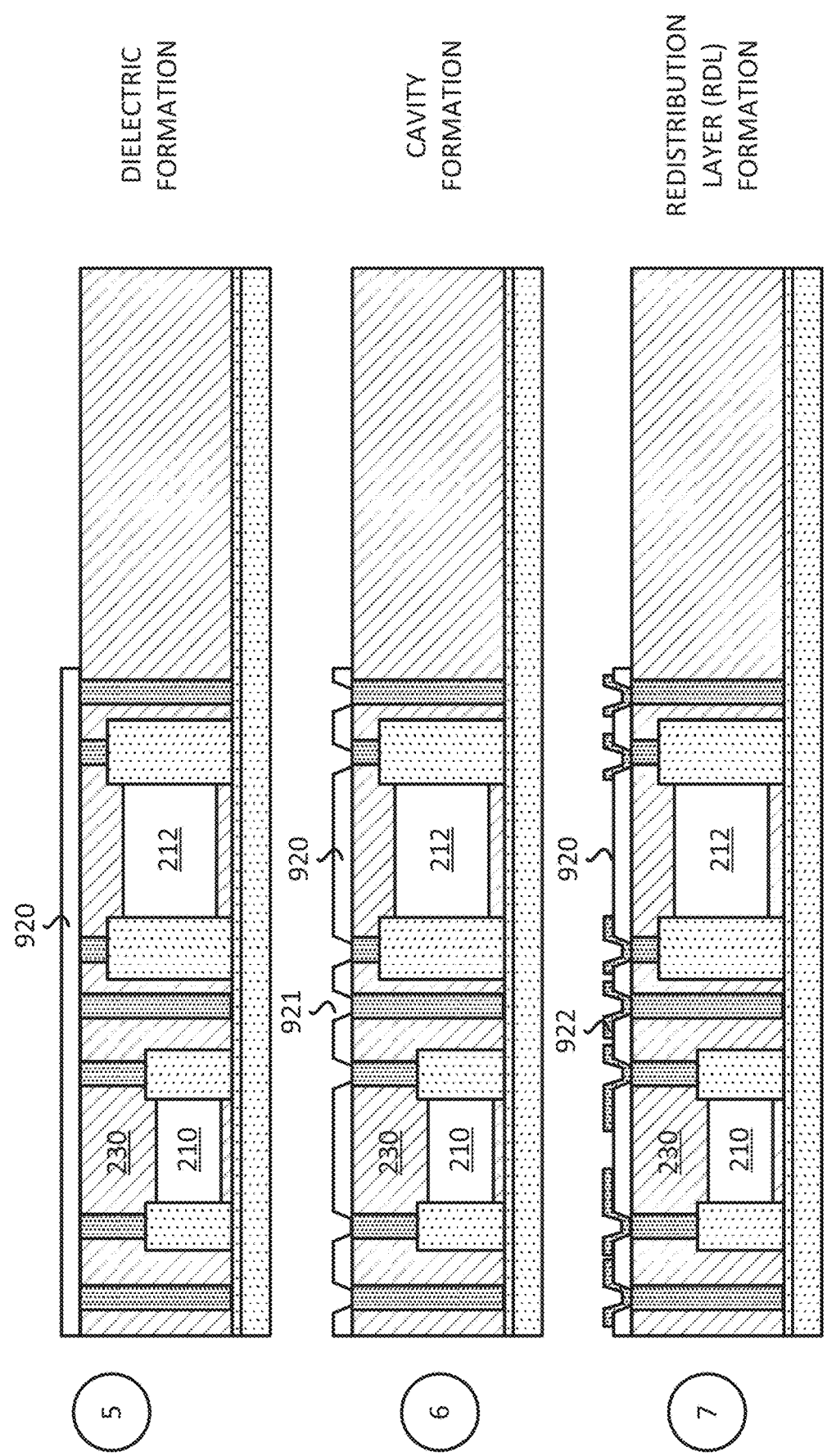

Stage 5, as shown in FIG. 9B, illustrates a state after a dielectric layer 920 is formed (e.g., disposed) over the encapsulation layer 230. The dielectric layer 920 may include a polymer material. However, different implementations may include different materials. The dielectric layer 920 may include PSR, SR, PID and/or ABF.

Stage 6 illustrates a state after cavities 921 are formed in the dielectric layer 920. A laser process and/or an etching process (e.g., photo etching process) may be used to form the cavities 921. A photo etching process may be used when the dielectric layer 920 includes a photo imageable dielectric layer.

Stage 7 illustrates a state after a plurality of redistribution interconnects 922 is formed over the dielectric layer 920 and the cavities 921. Forming the plurality of redistribution interconnects 922 may include forming a seed layer, performing a lithography process, a plating process, a stripping process and/or an etching process. Stage 7 illustrates an example of forming a redistribution layer (e.g., redistribution metal layer) for the redistribution portion 202. The plurality of redistribution interconnects 922 may be part of the plurality of redistribution interconnects 222. The plurality of redistribution interconnects 922 may be part of a first redistribution layer of a redistribution portion. The plurality of redistribution interconnects 922 may include a U-shape interconnect and/or a V-shape interconnect.

Figure 9C:
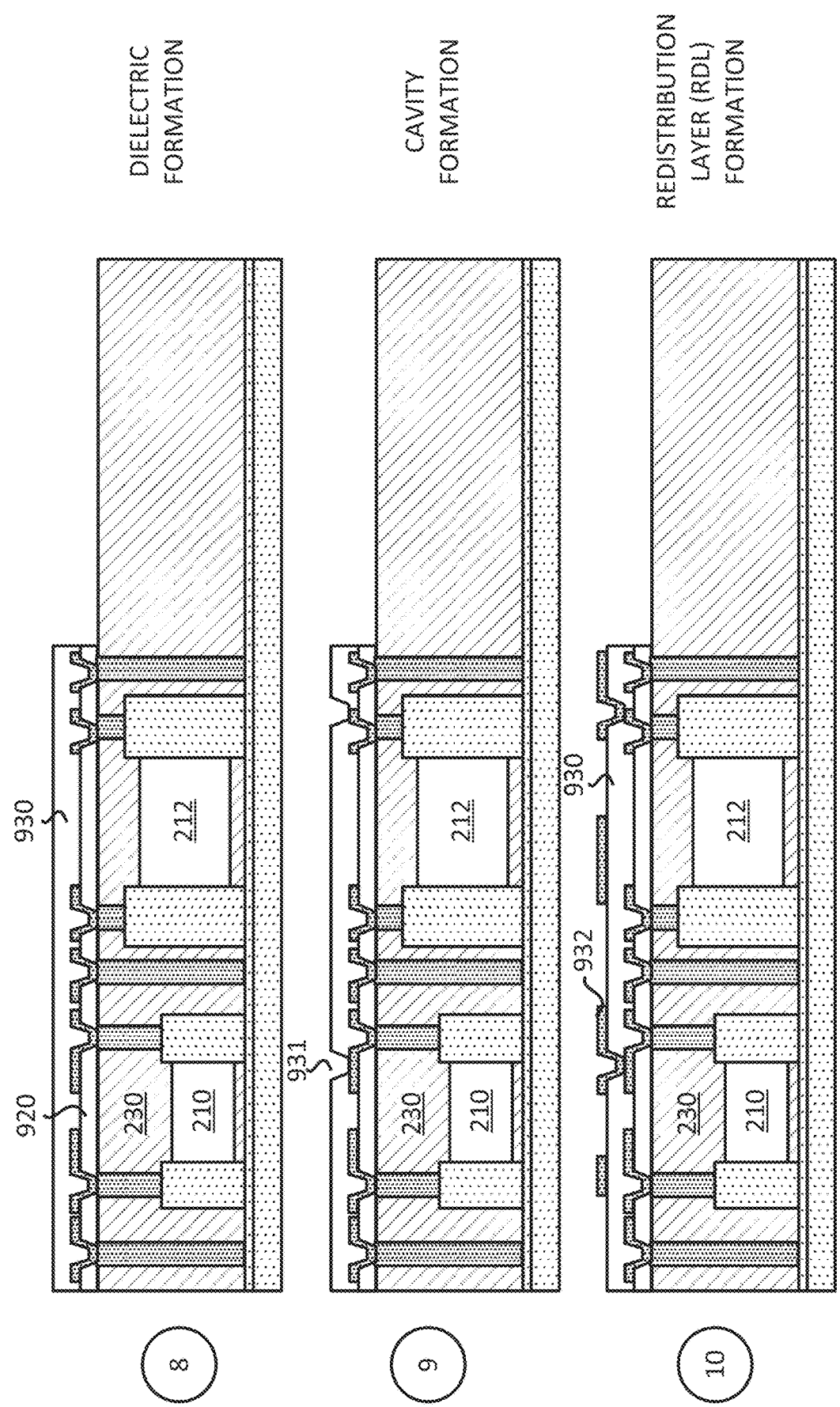

Stage 8, as shown in FIG. 9C, illustrates a state after a dielectric layer 930 is formed (e.g., disposed) over the dielectric layer 920. The dielectric layer 930 may include a polymer material. However, different implementations may include different materials. The dielectric layer 930 may include PSR, SR, PID and/or ABF.

Stage 9 illustrates a state after cavities 931 are formed in the dielectric layer 930. A laser process and/or an etching process (e.g., photo etching process) may be used to form the cavities 931. A photo etching process may be used when the dielectric layer 930 includes a photo imageable dielectric layer.

Stage 10 illustrates a state after a plurality of redistribution interconnects 932 is formed over the dielectric layer 930 and the cavities 931. Forming the plurality of redistribution interconnects 932 may include forming a seed layer, performing a lithography process, a plating process, a stripping process and/or an etching process. Stage 10 illustrates an example of forming a redistribution layer (e.g., redistribution metal layer) for the redistribution portion 202. The plurality of redistribution interconnects 932 may be part of the plurality of redistribution interconnects 222. The plurality of redistribution interconnects 932 may be part of a second redistribution layer for a redistribution portion. The plurality of redistribution interconnects 932 may include a U-shape interconnect and/or a V-shape interconnect.

Figure 9D:
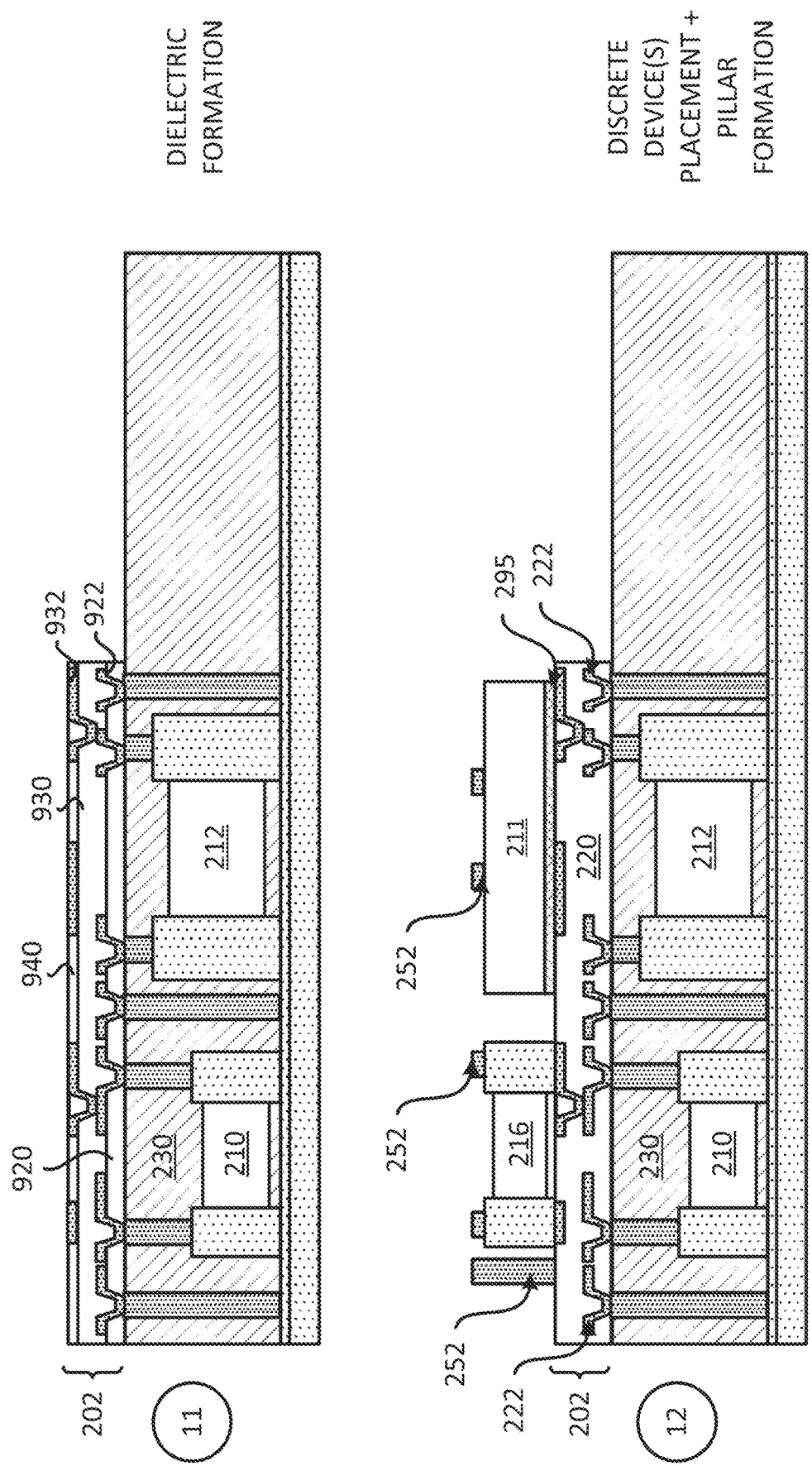

Stage 11, as shown in FIG. 9D, illustrates a state after a dielectric layer 940 is formed (e.g., disposed) over the dielectric layer 930. The dielectric layer 940 may include a polymer material. However, different implementations may include different materials. The dielectric layer 940 may include PSR, SR, PID and/or ABF. The dielectric layers 920, 930 and 940 may define the at one dielectric layer 220.

Stage 12 illustrates a state after (i) the integrated device 211 and the passive device 216 are placed over the redistribution portion 202 and (ii) the plurality of pillars 252 are provided over the redistribution portion 202, the integrated device 211 and the passive device 216. A pick and place method may be used to place the integrated device 211 and the passive device 216. An adhesive 295 may be used to couple the integrated device 211 to the redistribution portion 202. Different implementations may place different discrete devices and/or different number of discrete devices over the redistribution portion 202. A plating process may be used to form the plurality of pillars 252.

Figure 9E:
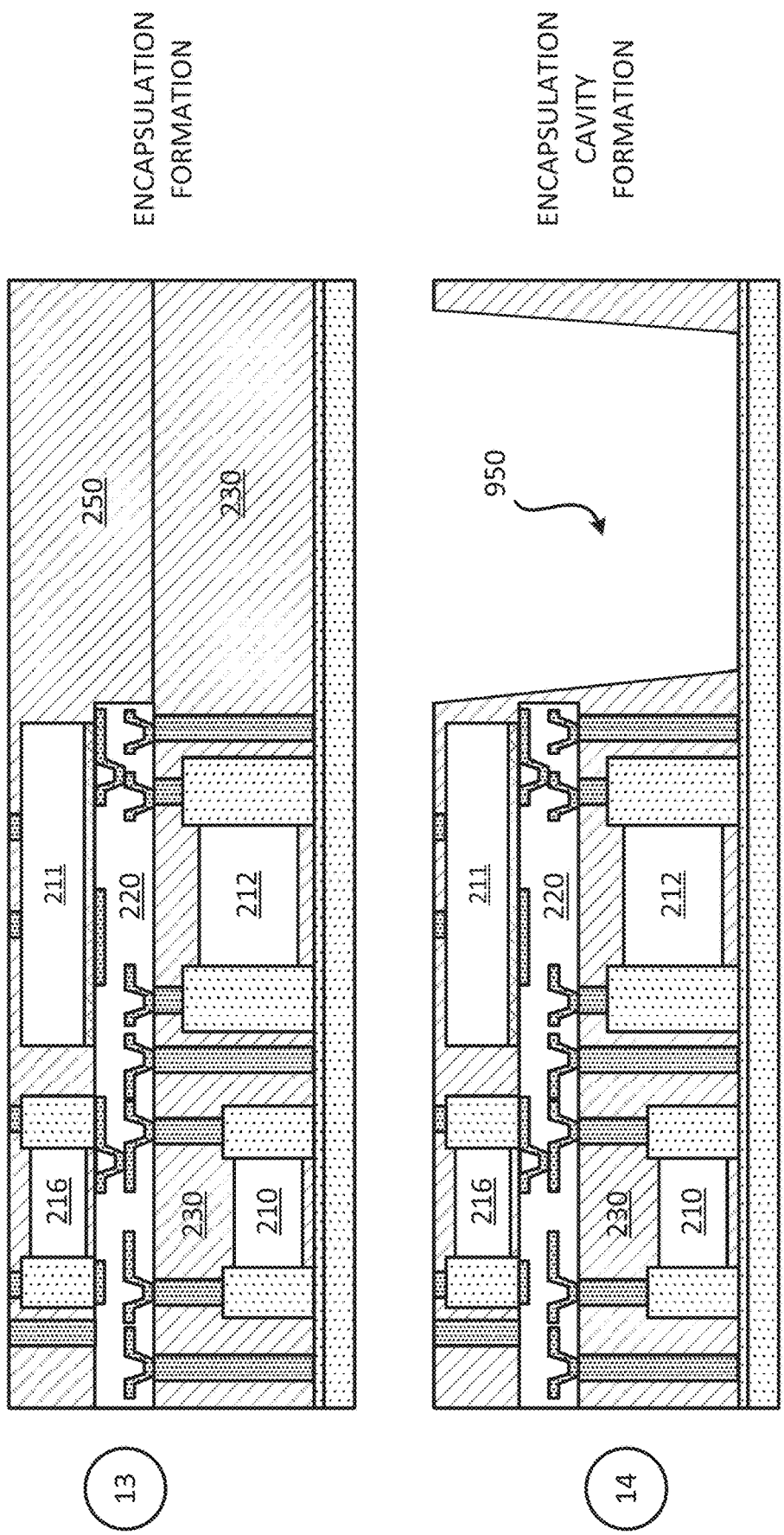

Stage 13, as shown in FIG. 9E, illustrates a state after the encapsulation layer 250 is formed over the redistribution portion 202 and the encapsulation layer 230, such that the encapsulation layer 250 at least partially encapsulates the integrated device 211, the passive device 216 and the plurality of pillars 252. The process of forming and/or disposing the encapsulation layer 250 may include using a compression and transfer molding process, a sheet molding process, or a liquid molding process. A grinding process may be used to remove a portion of the encapsulation layer 250. The grinding process may also remove portions of the plurality of pillars 252.

Stage 14 illustrates a state after a cavity 950 is formed in the encapsulation layer 230 and the encapsulation layer 250. It is noted that the encapsulation layer 230 and the encapsulation layer 250 may be considered as one (or the same) encapsulation layer. A laser process or/and an etching process (e.g., photo etching process) may be used to form the cavity 950.

Figure 9F:
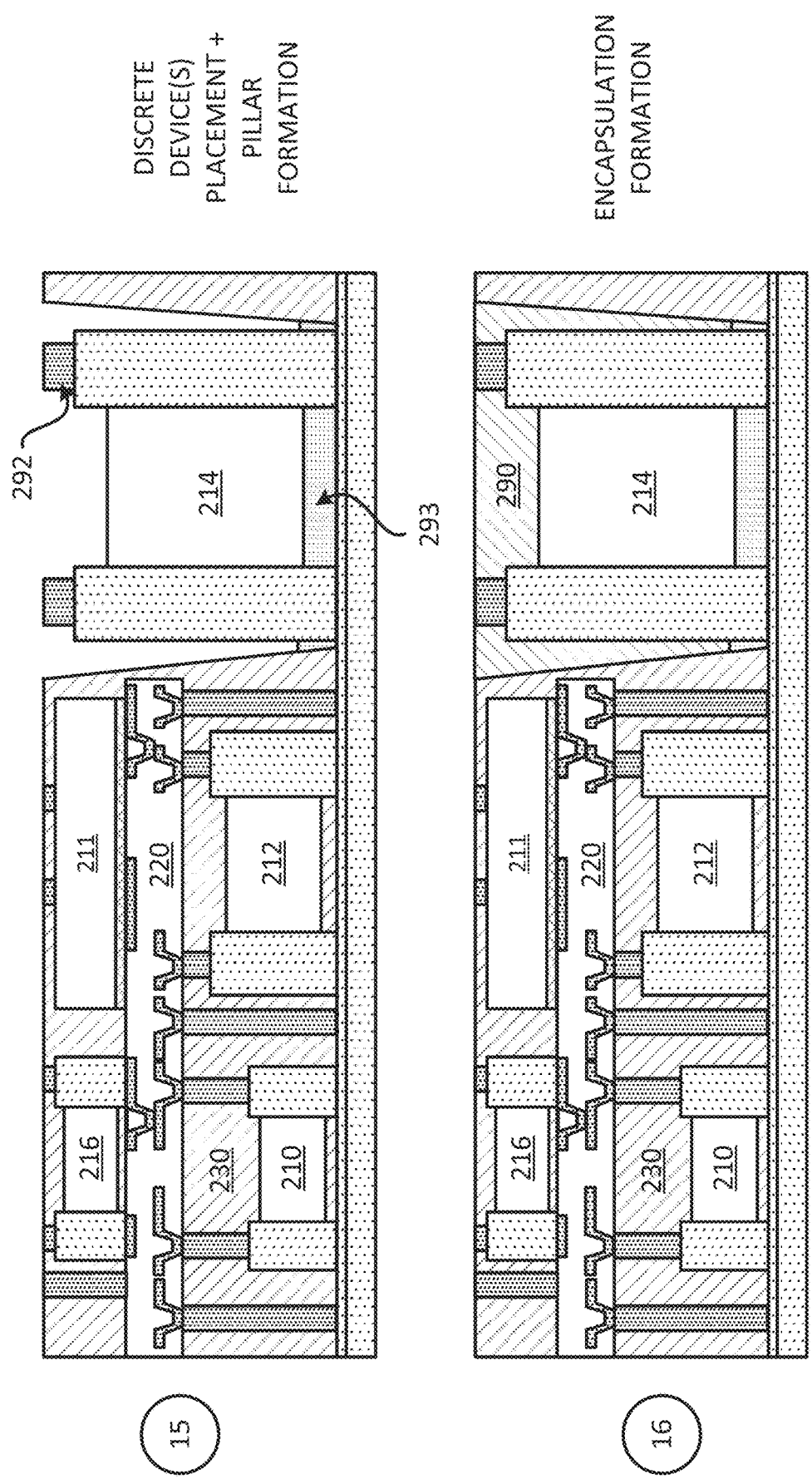

Stage 15, as shown in FIG. 9F, illustrates a state after (i) the passive device 214 is in the cavity 950 and over the adhesive layer 910 and (ii) the plurality of pillars 292 are provided over the passive device 214. A pick and place method may be used to place the passive device 214. An adhesive 293 may be used to couple the passive device 214 to the adhesive layer 910. Different implementations may place different discrete devices and/or different number of discrete devices. A plating process may be used to form the plurality of pillars 292.

Stage 16 illustrates a state after the encapsulation layer 290 is formed over the passive device 214, such that the encapsulation layer 290 at least partially encapsulates the passive device 214 and the plurality of pillars 292. The process of forming and/or disposing the encapsulation layer 290 may include using a compression and transfer molding process, a sheet molding process, or a liquid molding process. A grinding process may be used to remove a portion of the encapsulation layer 290. It is noted that the encapsulation layers 230, 250 and/or 290 may be considered as one (or the same) encapsulation layer. For example, the encapsulation layers 230, 250 and/or 290 may be indistinguishable from one another. The grinding process may also remove portions of the plurality of pillars 292.

Figure 9G:
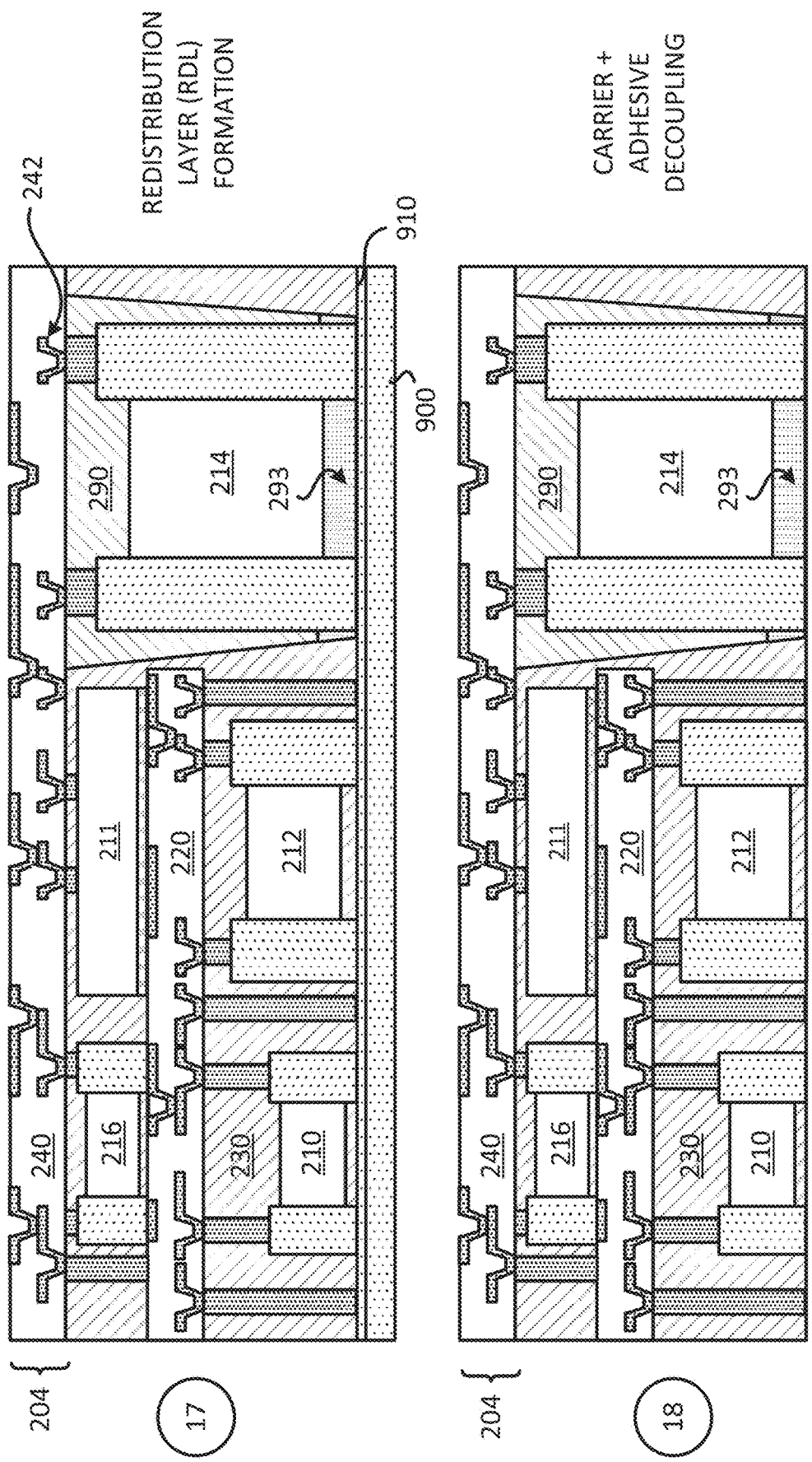

Stage 17, as shown in FIG. 9G, illustrates a state after the redistribution portion 204 is formed over the encapsulation layers 250 and 290. Forming the redistribution portion 204 includes forming at least one dielectric layer 240 and the plurality of redistribution interconnects 242. Forming the at least one dielectric layer 240 may include forming several dielectric layers and forming cavities in the dielectric layers. Forming the plurality of redistribution interconnects 242 may include forming a seed layer, performing a lithography process, a plating process, a stripping process and/or an etching process. Forming the redistribution portion 204 may be similar to forming the redistribution portion 202, as described in Stages 5-11 of FIGS. 9B-9D.

Stage 18 illustrates a state after the carrier 900 and the adhesive layer 910 are decoupled from the encapsulation layer 230. A grinding process may be used to decouple the carrier 900 and the adhesive layer 910. The encapsulation layer 230 may be detached from the adhesive layer 910.

Figure 9H:
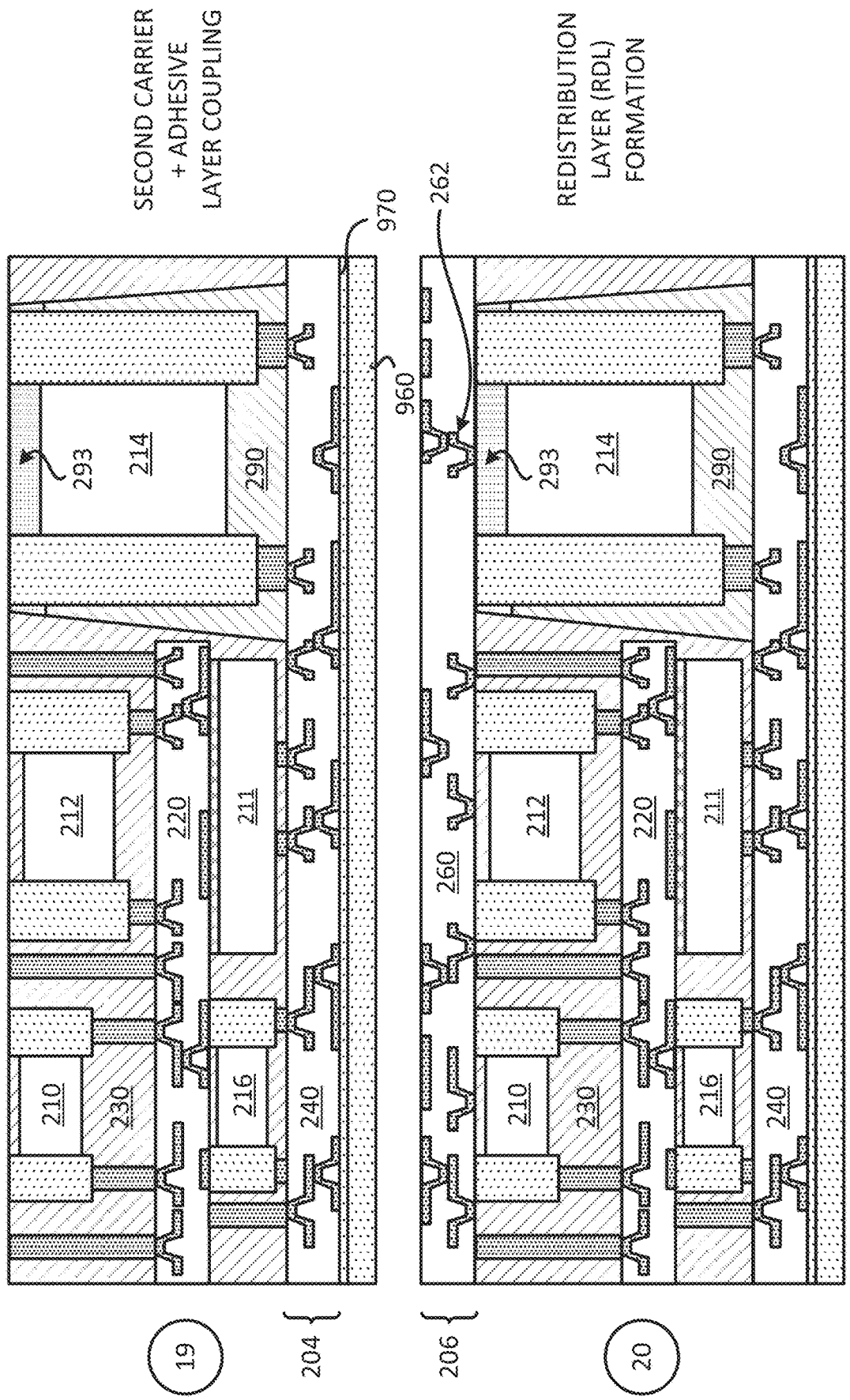

Stage 19, as shown in FIG. 9H, illustrates a state after another carrier 960 and another adhesive layer 970 are coupled to the redistribution portion 204. The carrier 960 may be a substrate and/or a wafer. The carrier 960 may include glass and/or silicon. The carrier 960 may be a second carrier. The adhesive layer 970 may be disposed (e.g., formed) over the carrier 960. The adhesive layer 970 may be an adhesive film (e.g., tape).

Stage 20 illustrates a state after the redistribution portion 206 is formed over the encapsulation layer 230. Forming the redistribution portion 206 includes forming at least one dielectric layer 260 and the plurality of redistribution interconnects 262. Forming the at least one dielectric layer 260 may include forming several dielectric layers and forming cavities in the dielectric layers. Forming the plurality of redistribution interconnects 262 may include forming a seed layer, performing a lithography process, a plating process, a stripping process and/or an etching process. Forming the redistribution portion 206 may be similar to forming the redistribution portion 202, as described in Stages 5-11 of FIGS. 9B-9D.

Figure 9I:
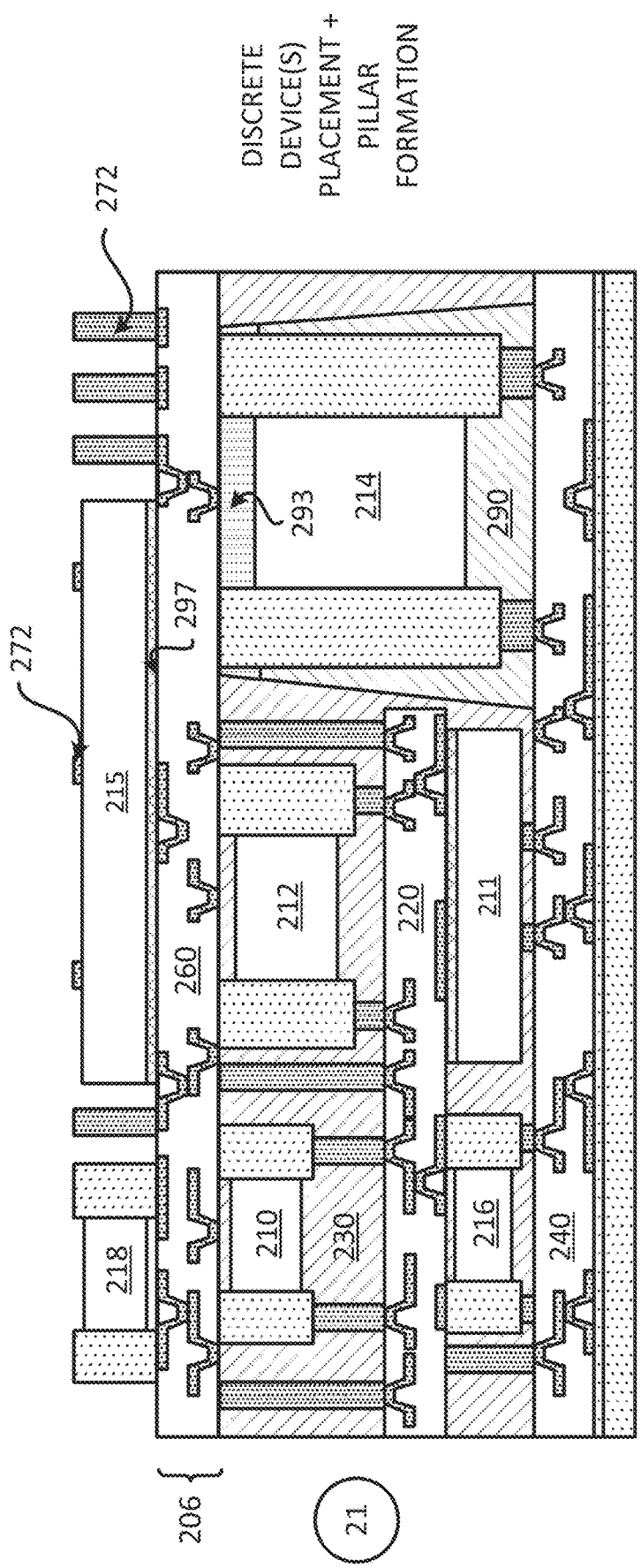

Stage 21, as shown in FIG. 9I, illustrates a state after (i) the integrated device 215 and the passive device 218 are placed over the redistribution portion 206 and (ii) the plurality of pillars 272 are provided over the redistribution portion 206, the integrated device 215 and the passive device 218. A pick and place method may be used to place the integrated device 215 and the passive device 218. An adhesive 297 may be used to couple the integrated device 215 to the redistribution portion 206. Different implementations may place different discrete devices and/or different number of discrete devices over the redistribution portion 206. A plating process may be used to form the plurality of pillars 272.

Figure 9J:
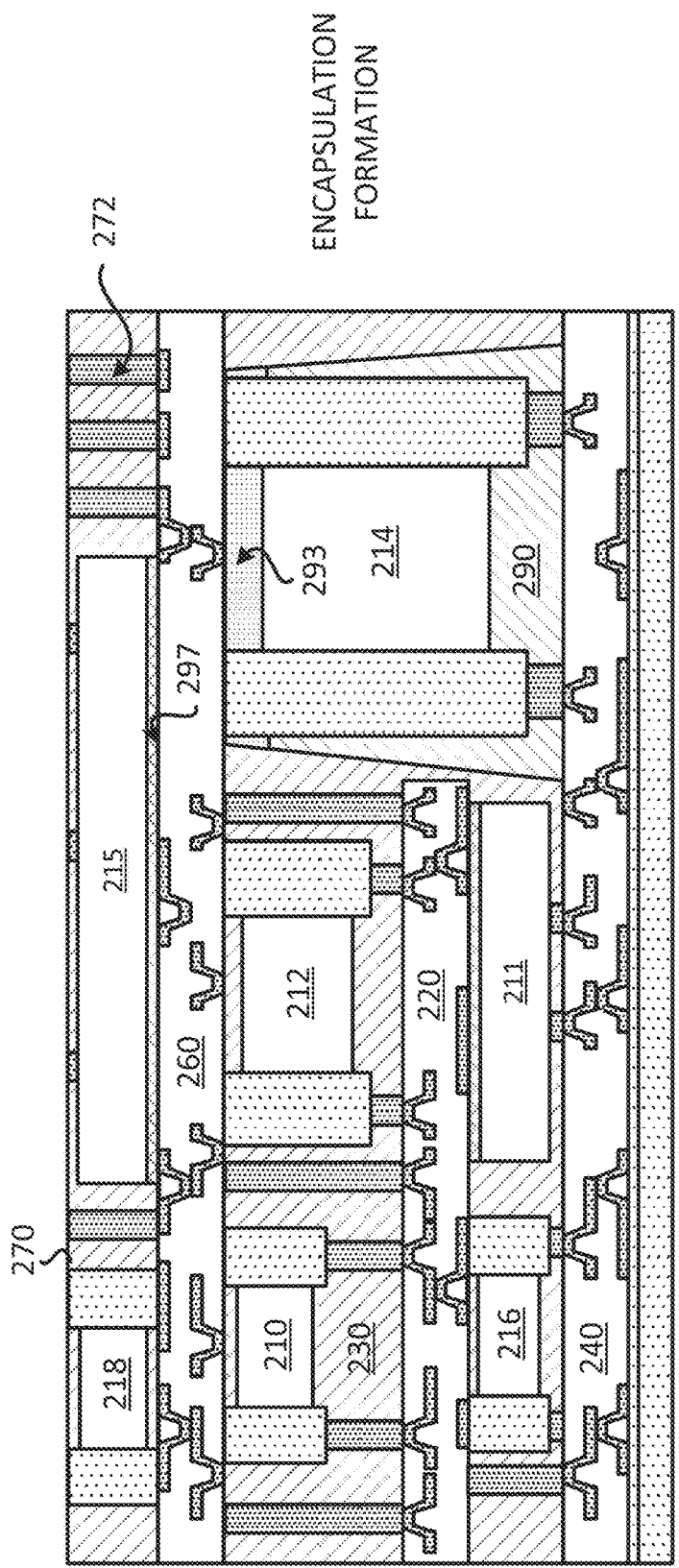

Stage 22, as shown in FIG. 9J, illustrates a state after the encapsulation layer 270 is formed over the redistribution portion 206, such that the encapsulation layer 270 at least partially encapsulates the integrated device 215, the passive device 218 and the plurality of pillars 272. The process of forming and/or disposing the encapsulation layer 270 may include using a compression and transfer molding process, a sheet molding process, or a liquid molding process. A grinding process may be used to remove a portion of the encapsulation layer 270. The grinding process may also remove portions of the plurality of pillars 272.

Figure 9K:
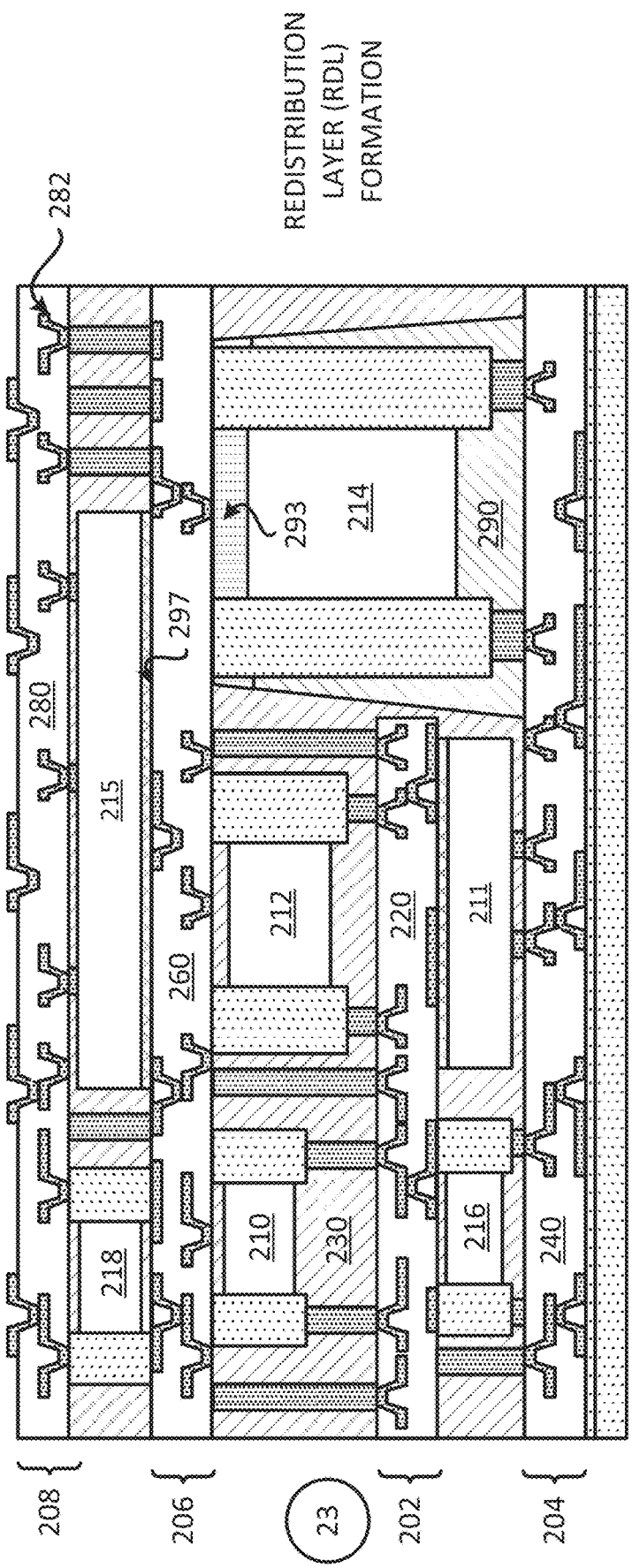

Stage 23, as shown in FIG. 9K, illustrates a state after the redistribution portion 208 is formed over the encapsulation layer 270. Forming the redistribution portion 208 includes forming at least one dielectric layer 280 and the plurality of redistribution interconnects 282. Forming the at least one dielectric layer 280 may include forming several dielectric layers and forming cavities in the dielectric layers. Forming the plurality of redistribution interconnects 282 may include forming a seed layer, performing a lithography process, a plating process, a stripping process and/or an etching process. Forming the redistribution portion 208 may be similar to forming the redistribution portion 202, as described in Stages 5-11 of FIGS. 9B-9D. Stage 23 may illustrate the package 200, as described in FIG. 2, coupled to an adhesive layer.

Figure 9L:
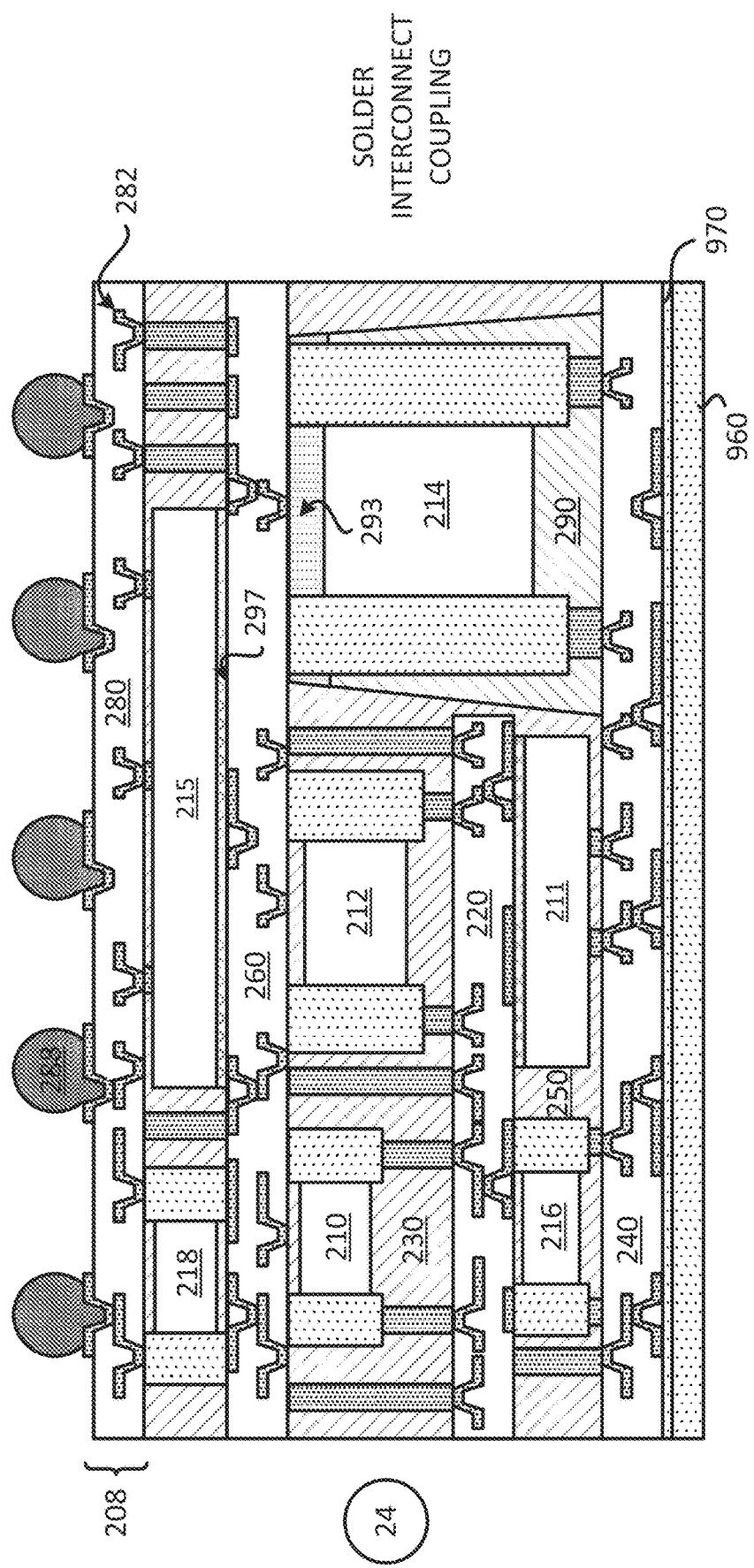

Stage 24, as shown in FIG. 9L, illustrates a state after the carrier 960 and the adhesive layer 970 are decoupled from the redistribution portion 204, and after the plurality of solder interconnects 288 is coupled to the redistribution portion 208. In particular, the plurality of solder interconnects 288 may be coupled to the plurality of redistribution interconnects 282. A reflow process may be used to couple the plurality of solder interconnects 288. Stage 24 may illustrate the package 200, as described in FIG. 2.

Figure 9M:
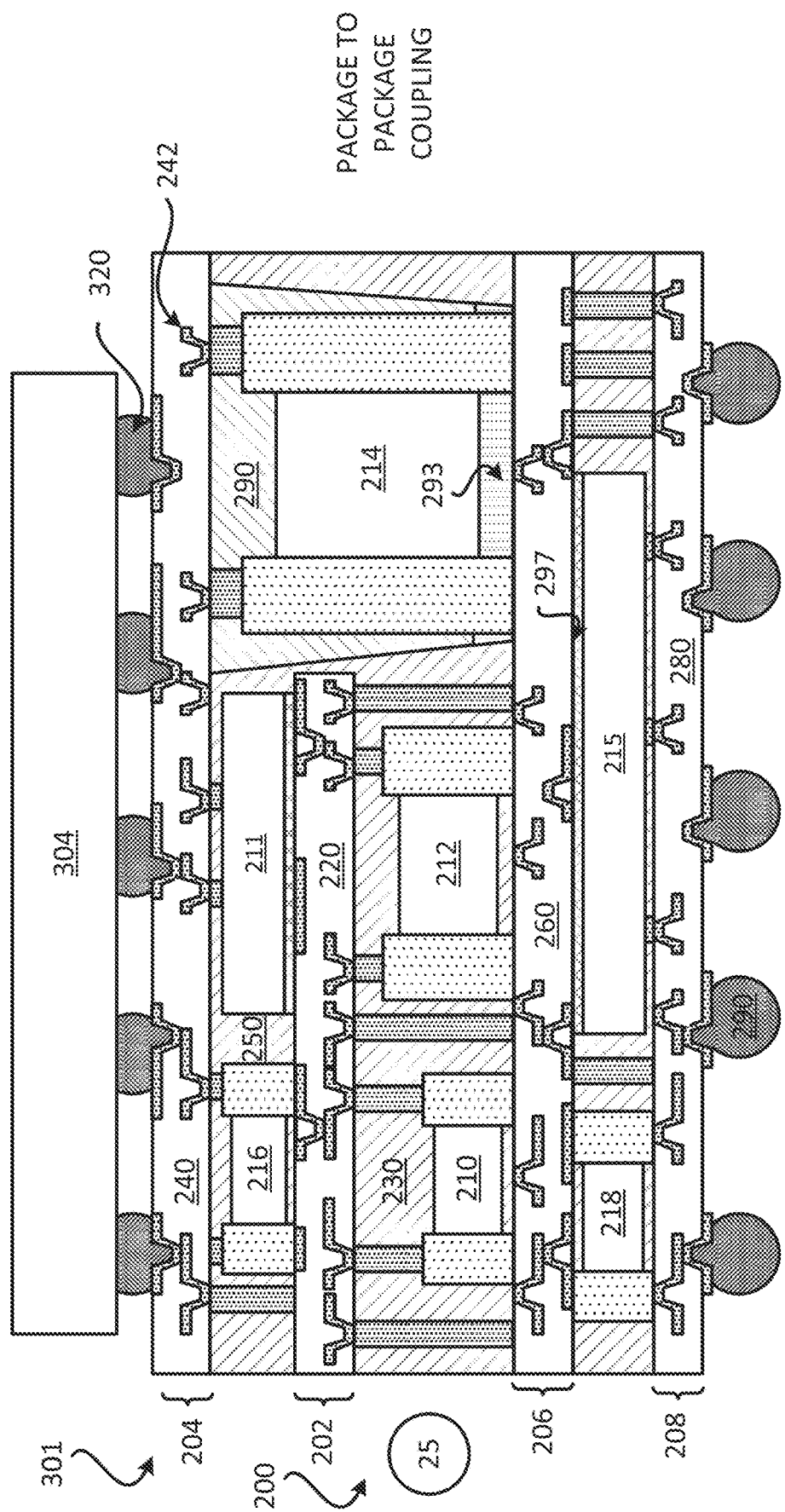

Stage 25, as shown in FIG. 9M, illustrates a state after the package 304 is coupled to the package 200 through the plurality of solder interconnects 320, to form the package on package (PoP) 301. The package 304 is coupled to the redistribution portion 204 through the plurality of solder interconnects 320. The package 304 may be coupled to the plurality of redistribution interconnects 242, through the plurality of solder interconnects 320. A reflow process may be used to couple the plurality of solder interconnects 320.

Exemplary Sequence for Fabricating a Package on Package (PoP) That Includes a Package Comprising Multiple Redistribution Portions FIGS. 10A-10I illustrate an exemplary sequence for providing or fabricating a PoP comprising a package that includes multiple redistribution portions. In some implementations, the sequence of FIGS. 10A-10I may be used to provide or fabricate the PoP 601 of FIG. 3, or any of the PoPs and/or packages described in the disclosure.

It should be noted that the sequence of FIGS. 10A-10I may combine one or more stages in order to simplify and/or clarify the sequence for providing or fabricating the PoP. In some implementations, the order of the processes may be changed or modified. In some implementations, one or more of processes may be replaced or substituted without departing from the spirit of the disclosure. Different implementations may fabricate a PoP differently. FIGS. 10A-10I may be used to fabricate a PoP and/or a package.

Figure 10A:
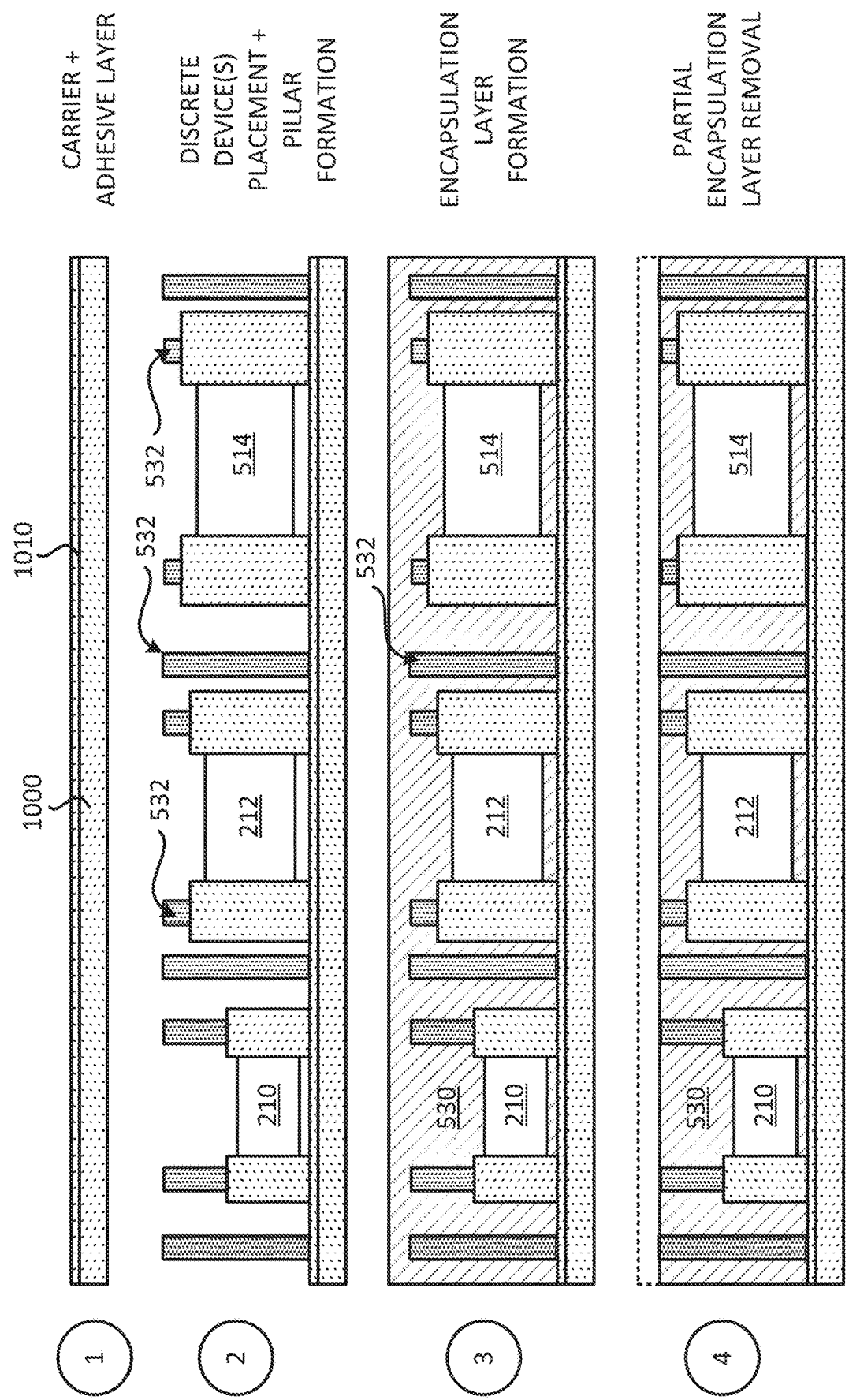
FIGS. 10A-10I illustrate an exemplary sequence for fabricating a package on package (PoP) with a package that includes multiple redistribution portions.

Stage 1, as shown in FIG. 10A, illustrates a state after a carrier 1000 and an adhesive layer 1010 are provided. The carrier 1000 may be a substrate and/or a wafer. The carrier 1000 may include glass and/or silicon. The carrier 1000 may be a first carrier. The adhesive layer 1010 may be disposed (e.g., formed) over the carrier 1000. The adhesive layer 1010 may be an adhesive film.

Stage 2 illustrates a state after (i) the passive device 210, the passive device 212 and the passive device 514 are placed over the adhesive layer 1010 and the carrier 1000 and (ii) the plurality of pillars 532 are provided over the passive device 210, the passive device 212, the passive device 514, the adhesive layer 1010 and the carrier 1000. A pick and place method may be used to place the passive device 210, the passive device 212, and the passive device 514. Different implementations may place different discrete devices and/or different number of discrete devices over the adhesive layer 1010 and the carrier 1000. A plating process may be used to form the plurality of pillars 532.

Stage 3 illustrates a state after the encapsulation layer 530 is formed over the adhesive layer 1010 and the carrier 1000, such that the encapsulation layer 530 at least partially encapsulates the passive device 210, the passive device 212, the passive device 514 and the plurality of pillars 532. The process of forming and/or disposing the encapsulation layer 530 may include using a compression and transfer molding process, a sheet molding process, or a liquid molding process.

Stage 4 illustrates a state after a portion of the encapsulation layer 530 is removed. A grinding process may be used to remove a portion of the encapsulation layer 530. The grinding process may also remove portions of the plurality of pillars 532.

Figure 10B:
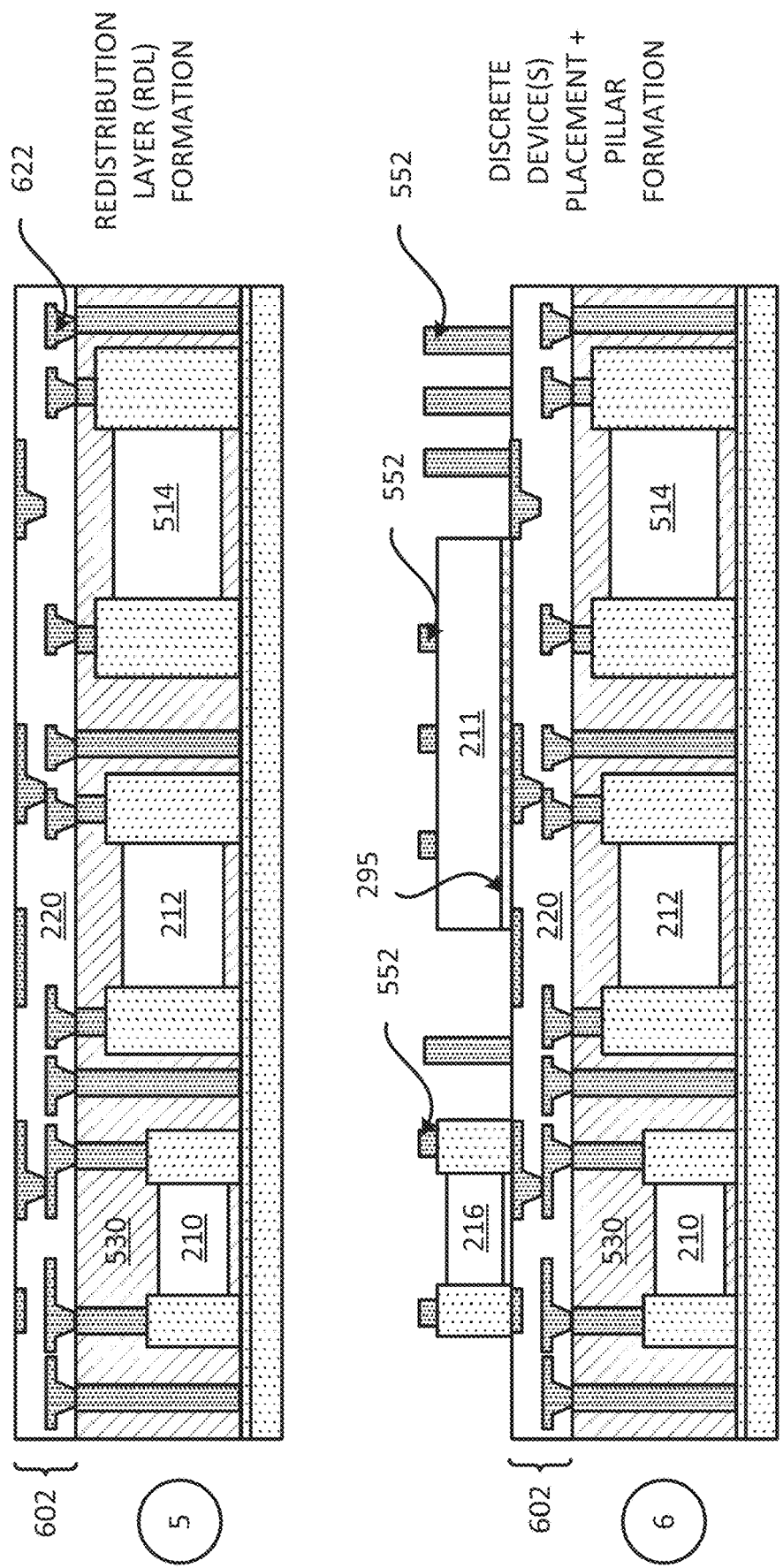

Stage 5, as shown in FIG. 10B, illustrates a state after the redistribution portion 602 is formed over the encapsulation layer 530. Forming the redistribution portion 602 includes forming at least one dielectric layer 220 and the plurality of redistribution interconnects 622. Forming the at least one dielectric layer 220 may include forming several dielectric layers and forming cavities in the dielectric layers. The dielectric layer 220 may include a polymer material. However, different implementations may include different materials. The dielectric layer 220 may include PSR, SR, PID and/or ABF. Forming the plurality of redistribution interconnects 622 may include forming a seed layer, performing a lithography process, a plating process, a stripping process and/or an etching process. Forming the redistribution portion 602 may be similar to forming the redistribution portion 202, as described in Stages 5-11 of FIGS. 9B-9D. However, the plurality of redistribution interconnects 622 may have different shapes than the plurality of redistribution interconnects 222.

Stage 6 illustrates a state after (i) the integrated device 211 and the passive device 216 are placed over the redistribution portion 602 and (ii) the plurality of pillars 552 are provided over the redistribution portion 562, the integrated device 211 and the passive device 216. A pick and place method may be used to place the integrated device 211 and the passive device 216. An adhesive 295 may be used to couple the integrated device 211 to the redistribution portion 602. Different implementations may place different discrete devices and/or different number of discrete devices over the redistribution portion 602. A plating process may be used to form the plurality of pillars 552.

Figure 10C:
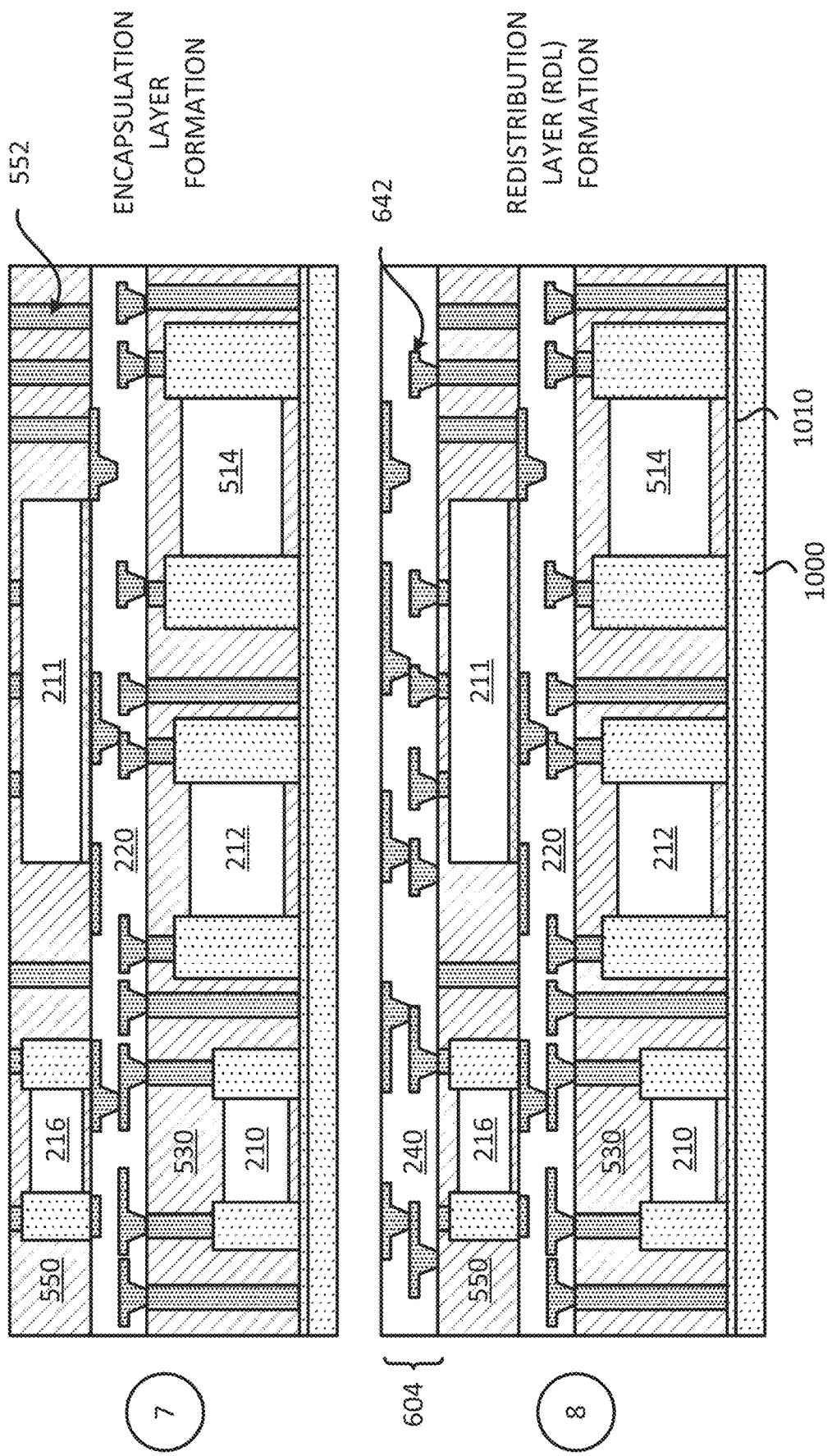

Stage 7, as shown in FIG. 10C, illustrates a state after the encapsulation layer 550 is formed over the redistribution portion 602 such that the encapsulation layer 550 at least partially encapsulates the integrated device 211, the passive device 216 and the plurality of pillars 552. The process of forming and/or disposing the encapsulation layer 550 may include using a compression and transfer molding process, a sheet molding process, or a liquid molding process. A grinding process may be used to remove a portion of the encapsulation layer 550. The grinding process may also remove portions of the plurality of pillars 552.

Stage 8 illustrates a state after the redistribution portion 604 is formed over the encapsulation layer 550. Forming the redistribution portion 604 includes forming at least one dielectric layer 240 and the plurality of redistribution interconnects 642. Forming the at least one dielectric layer 240 may include forming several dielectric layers and forming cavities in the dielectric layers. Forming the plurality of redistribution interconnects 642 may include forming a seed layer, performing a lithography process, a plating process, a stripping process and/or an etching process. Forming the redistribution portion 604 may be similar to forming the redistribution portion 202, as described in Stages 5-11 of FIGS. 9B-9D. However, the plurality of redistribution interconnects 642 may have different shapes than the plurality of redistribution interconnects 222.

Figure 10D:
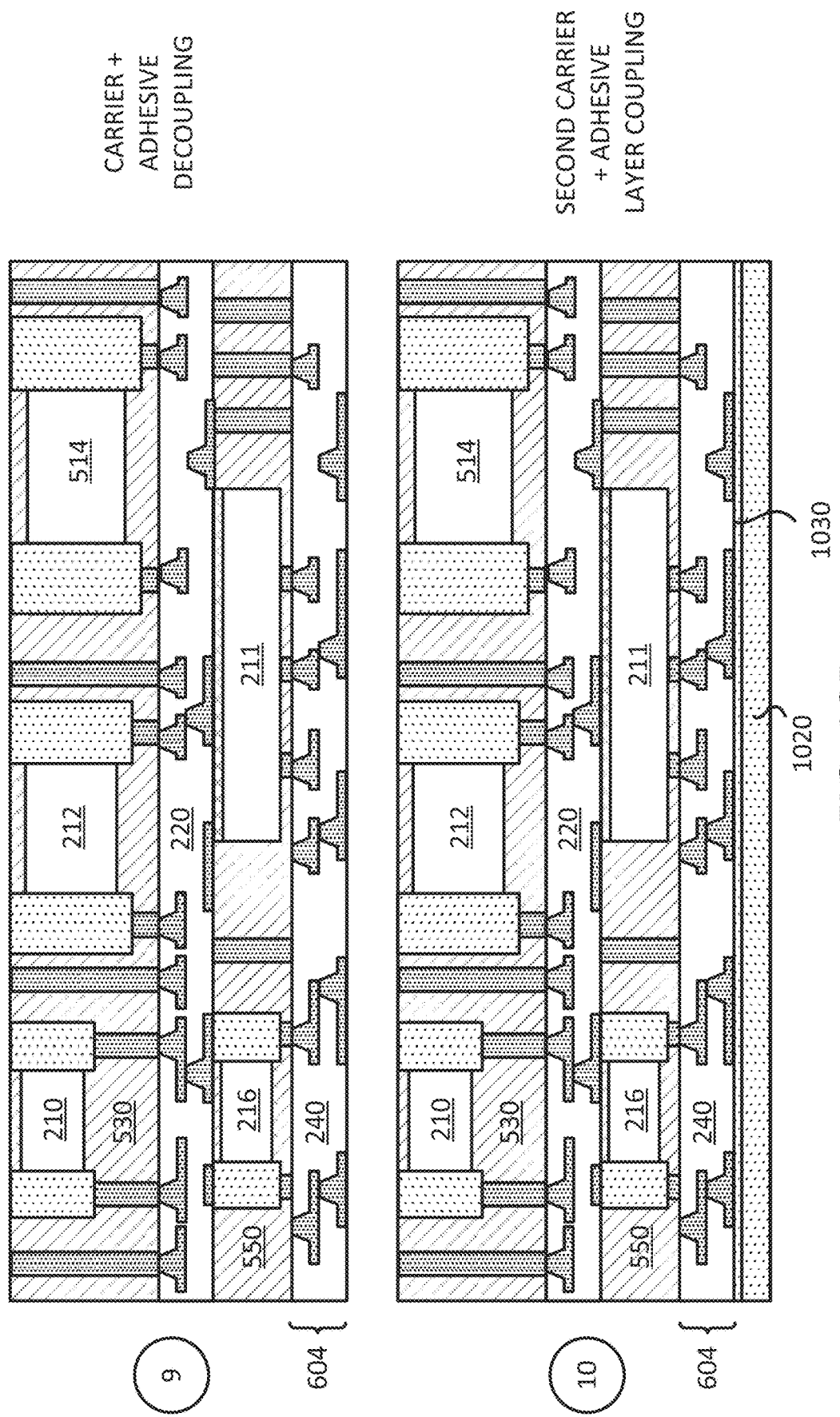

Stage 9, as shown in FIG. 10D, illustrates a state after the carrier 1000 and the adhesive layer 1010 are decoupled from the encapsulation layer 530.

Stage 10 illustrates a state after another carrier 1020 and another adhesive layer 1030 are coupled to the redistribution portion 604. The carrier 1060 may be a substrate and/or a wafer. The carrier 1060 may include glass and/or silicon. The carrier 1060 may be a second carrier. The adhesive layer 1070 may be disposed (e.g., formed) over the carrier 1060. The adhesive layer 1070 may be an adhesive film (e.g., tape).

Figure 10E:
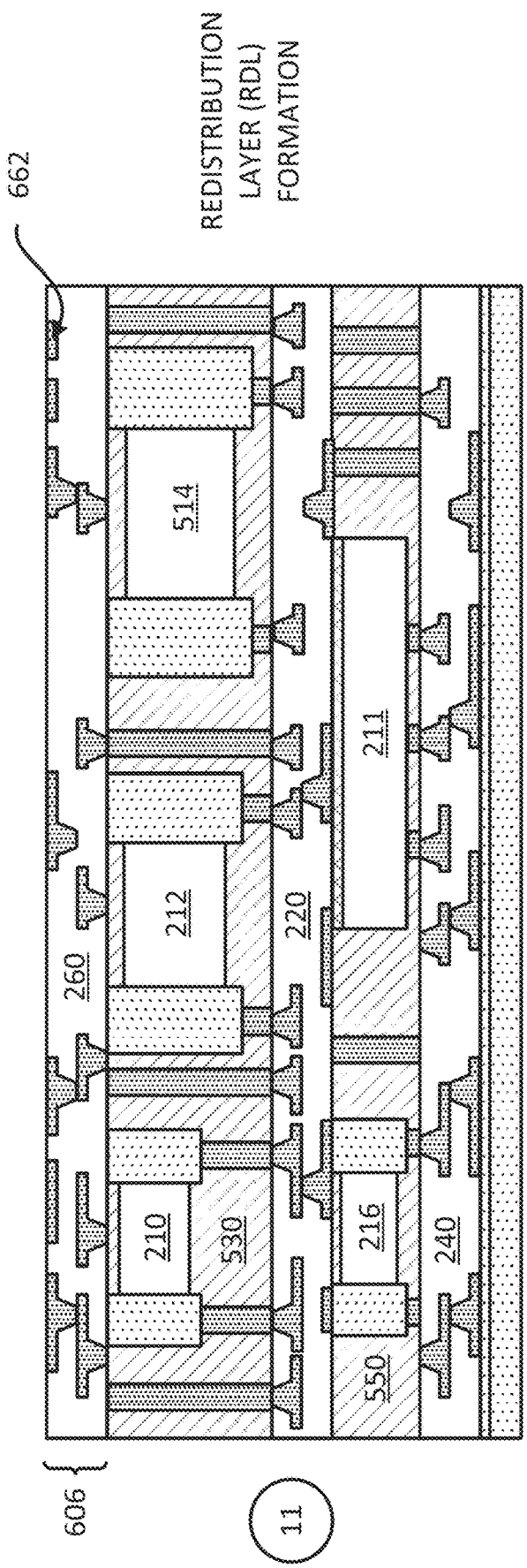

Stage 11, as shown in FIG. 10E, illustrates a state after the redistribution portion 606 is formed over the encapsulation layer 530. Forming the redistribution portion 606 includes forming at least one dielectric layer 260 and the plurality of redistribution interconnects 662. Forming the at least one dielectric layer 260 may include forming several dielectric layers and forming cavities in the dielectric layers. Forming the plurality of redistribution interconnects 662 may include forming a seed layer, performing a lithography process, a plating process, a stripping process and/or an etching process. Forming the redistribution portion 606 may be similar to forming the redistribution portion 202, as described in Stages 5-11 of FIGS. 9B-9D. However, the plurality of redistribution interconnects 662 may have different shapes than the plurality of redistribution interconnects 222.

Figure 10F:
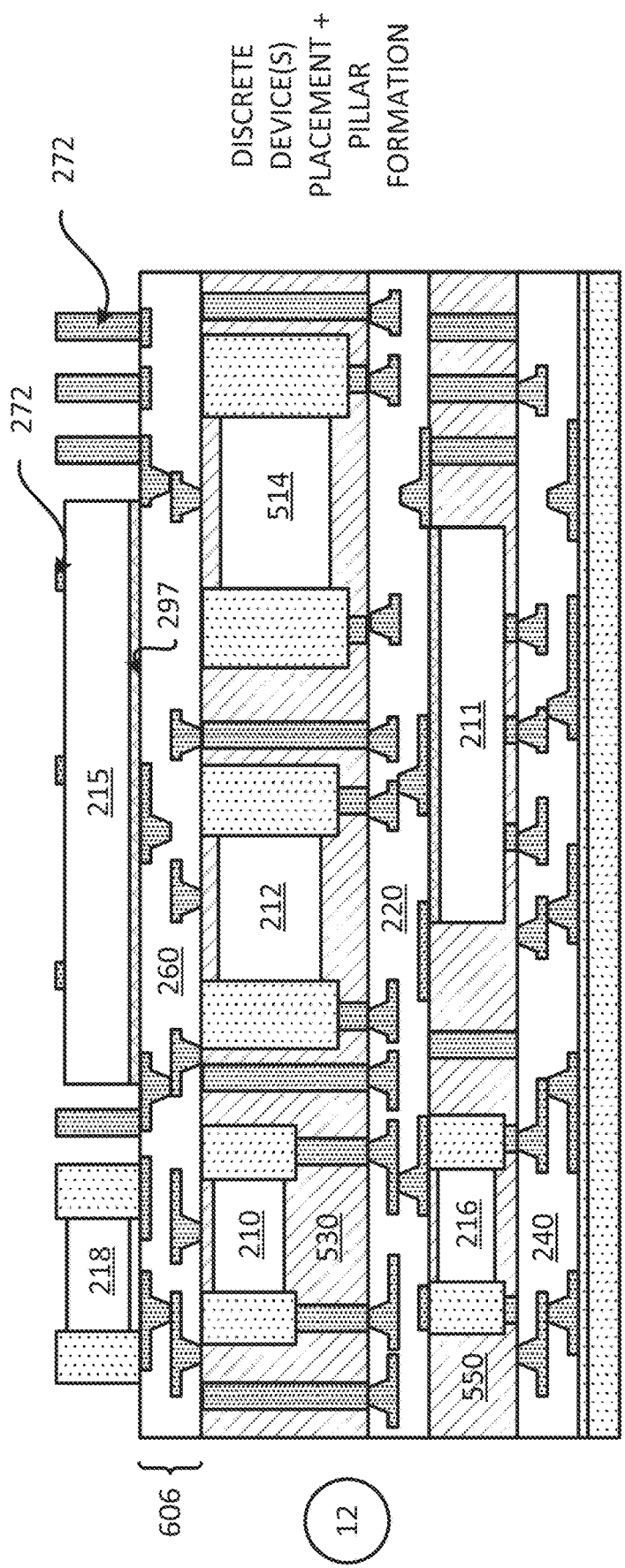

Stage 12, as shown in FIG. 10F, illustrates a state after (i) the integrated device 215 and the passive device 218 are placed over the redistribution portion 606 and (ii) the plurality of pillars 272 are provided over the redistribution portion 606, the integrated device 215 and the passive device 218. A pick and place method may be used to place the integrated device 215 and the passive device 218. An adhesive 297 may be used to couple the integrated device 215 to the redistribution portion 606. Different implementations may place different discrete devices and/or different number of discrete devices over the redistribution portion 606. A plating process may be used to form the plurality of pillars 272.

Figure 10G:
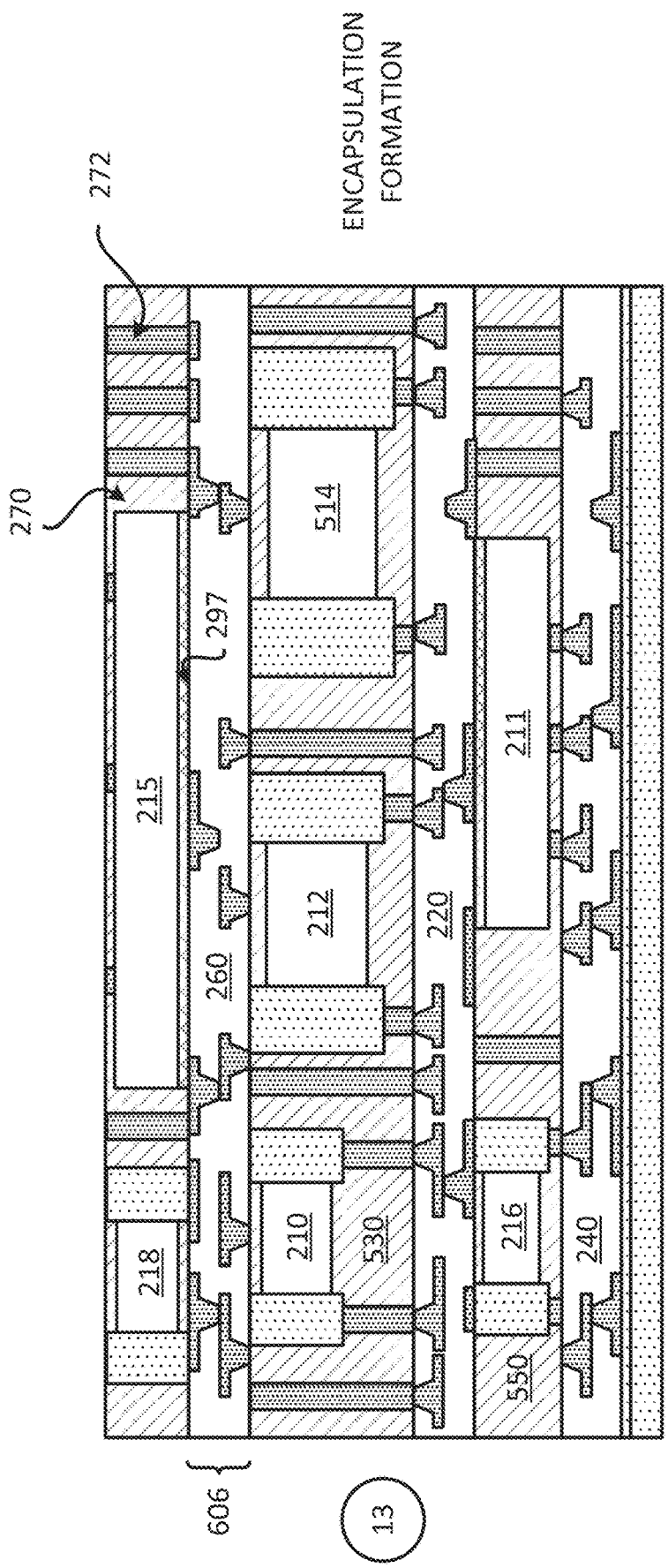

Stage 13, as shown in FIG. 10G, illustrates a state after the encapsulation layer 270 is formed over the redistribution portion 606, such that the encapsulation layer 270 at least partially encapsulates the integrated device 215, the passive device 218 and the plurality of pillars 272. The process of forming and/or disposing the encapsulation layer 270 may include using a compression and transfer molding process, a sheet molding process, or a liquid molding process. A grinding process may be used to remove a portion of the encapsulation layer 270. The grinding process may also remove portions of the plurality of pillars 272.

Figure 10H:
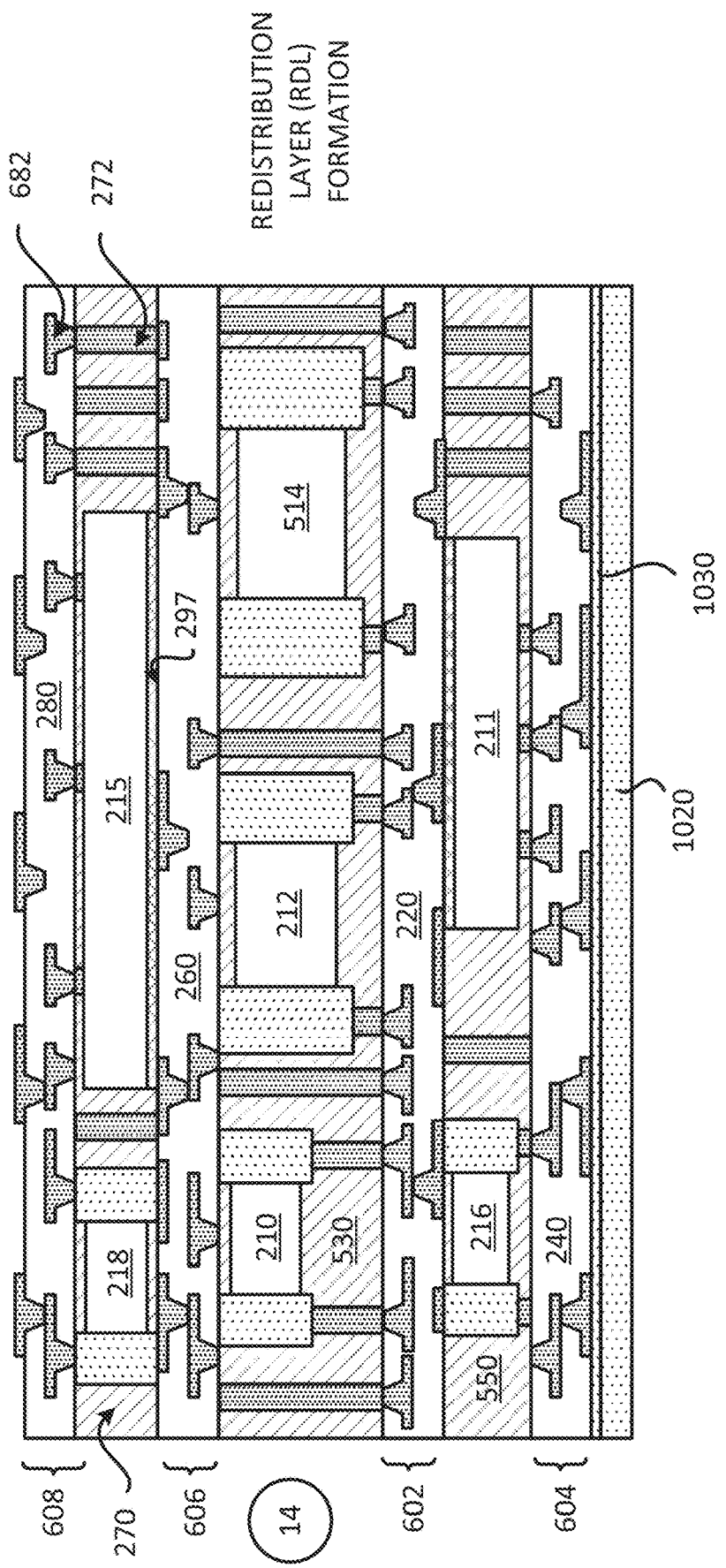

Stage 14, as shown in FIG. 10H, illustrates a state after the redistribution portion 608 is formed over the encapsulation layer 270. Forming the redistribution portion 208 includes forming at least one dielectric layer 280 and the plurality of redistribution interconnects 682. Forming the at least one dielectric layer 280 may include forming several dielectric layers and forming cavities in the dielectric layers. Forming the plurality of redistribution interconnects 682 may include forming a seed layer, performing a lithography process, a plating process, a stripping process and/or an etching process. Forming the redistribution portion 608 may be similar to forming the redistribution portion 202, as described in Stages 5-11 of FIGS. 9B-9D. However, the plurality of redistribution interconnects 682 may have different shapes than the plurality of redistribution interconnects 222. Stage 14 may illustrate the package 600 as described in FIG. 6, coupled to the carrier 1020 and the adhesive layer 1030

Figure 10I:
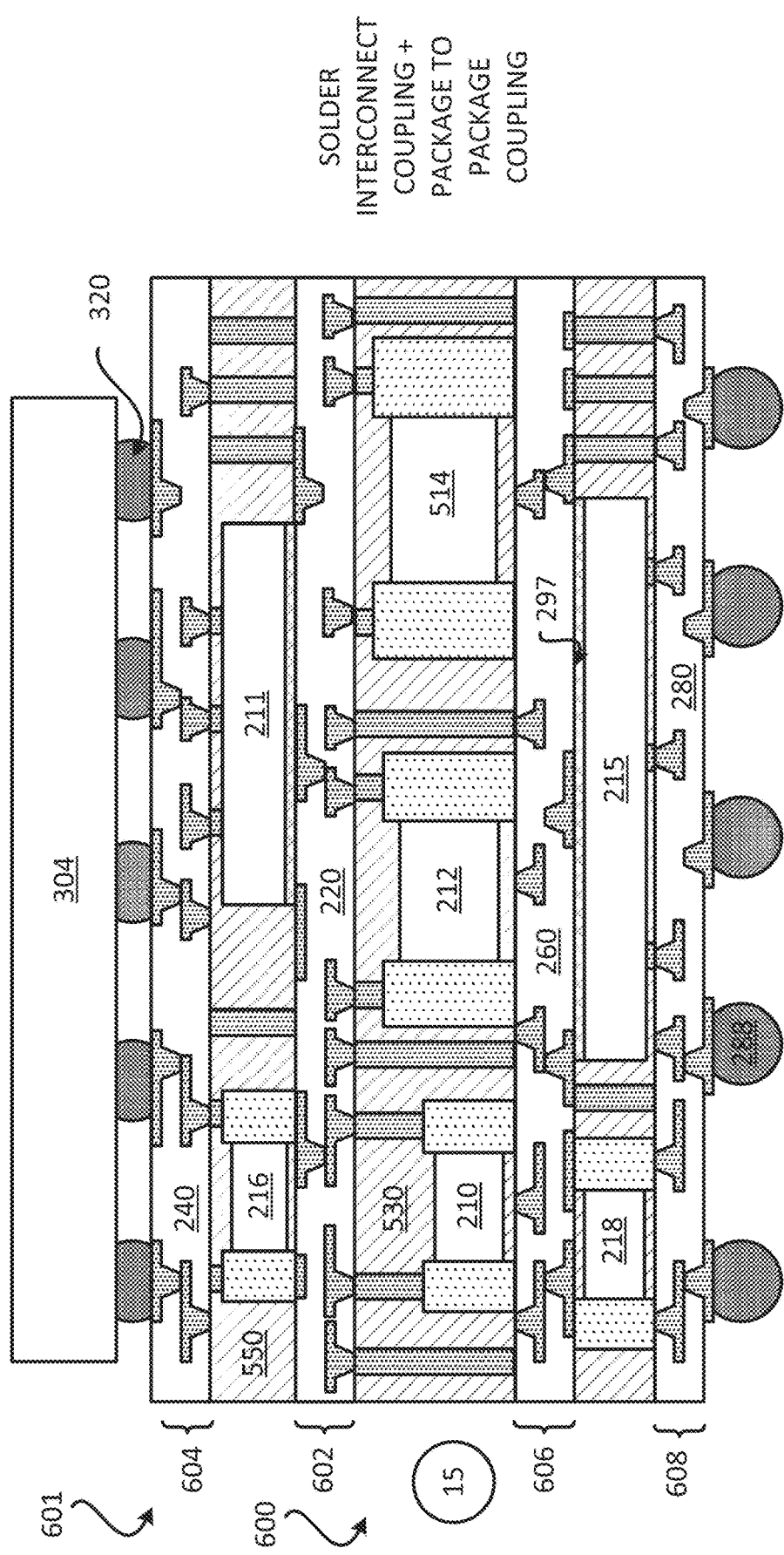

Stage 15, as shown in FIG. 10I, illustrates a state after (i) the carrier 1020 and the adhesive layer 1030 are decoupled from the redistribution portion 604, (ii) the plurality of solder interconnects 288 is coupled to the redistribution portion 608, and (iii) the package 304 is coupled to the package 200 through the plurality of solder interconnects 320, to form the package on package (PoP) 301. The plurality of solder interconnects 288 may be coupled to the plurality of redistribution interconnects 682. A reflow process may be used to couple the plurality of solder interconnects. The package 304 is coupled to the redistribution portion 604 through the plurality of solder interconnects 320. A reflow process may be used to couple the plurality of solder interconnects 320.

Figure 11:
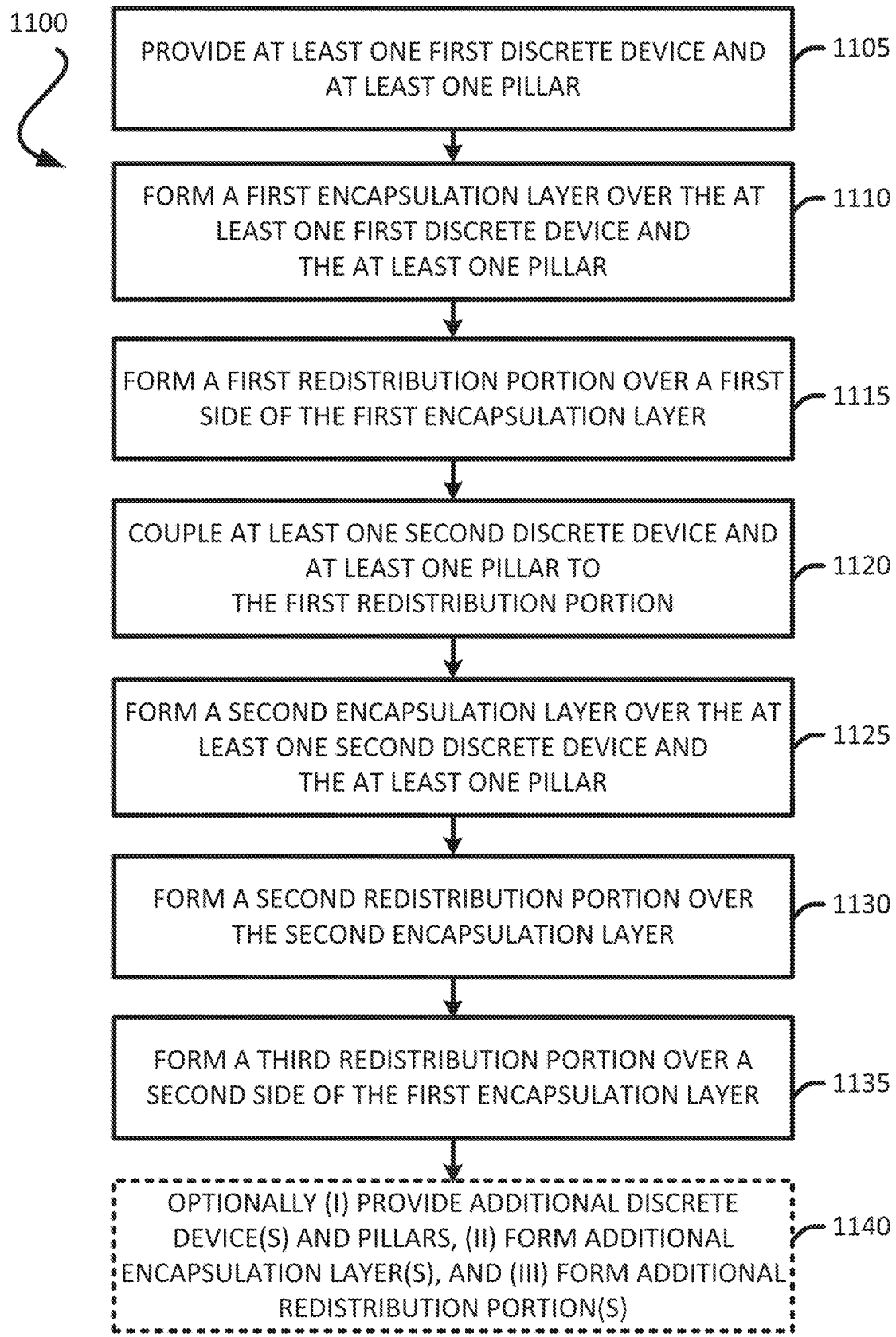
FIG. 11 illustrates an exemplary flow diagram of a method for fabricating a package that includes multiple redistribution portions.

Exemplary Flow Diagram of a Method for Fabricating a Package Comprising Multiple Redistribution Portions In some implementations, fabricating a package that includes multiple redistribution portions includes several processes. FIG. 11 illustrates an exemplary flow diagram of a method 1100 for providing or fabricating a package that includes multiple redistribution portions. In some implementations, the method 1100 of FIG. 11 may be used to provide or fabricate the package 200 of FIG. 2 described in the disclosure. However, the method 1100 may be used to provide or fabricate any of the packages described in the disclosure.

It should be noted that the sequence of FIG. 11 may combine one or more processes in order to simplify and/or clarify the method for providing or fabricating a package that includes multiple redistribution portions. In some implementations, the order of the processes may be changed or modified.

The method provides (at 1105) at least one first discrete device and at least one pillar. A pick and place may be used to provide the first discrete device. The at least one pillar (e.g., 232) may be formed using a plating process. Examples of the first discrete device include a passive device (e.g., 210) and an integrated device. The discrete devices may be formed over a carrier and an adhesive layer. The pillars may be formed over a carrier, and adhesive layer and the discrete devices. Stages 1-2 of FIG. 9A illustrate an example of providing a first discrete device and at least one pillar.

The method forms (at 1110) a first encapsulation layer (e.g., 230) over at least one discrete device (e.g., passive device 210) and at least one pillar (e.g., 232). The first encapsulation layer may at least partially encapsulate the pillars, the integrated devices and/or the passive devices. The process of forming and/or disposing the first encapsulation layer (e.g., 230) may include using a compression and transfer molding process, a sheet molding process, or a liquid molding process. A grinding process may be used to remove a portion of the first encapsulation layer. Stages 3-4 of FIG. 9A illustrate an example of forming a first encapsulation layer.

The method forms (at 1115) a first redistribution portion (e.g., 202) over the first encapsulation layer (e.g., 230), the at least one discrete device and the pillars. Forming the first redistribution portion may include forming at least one dielectric layer (e.g., 220) and a plurality of redistribution interconnects (e.g., 222). Forming the plurality of redistribution interconnects 222 may include forming a seed layer, performing a lithography process, a plating process, a stripping process and/or an etching process. Forming a redistribution portion may include forming at least one redistribution layer. Stages 5-11 of FIGS. 9B-9D may illustrate examples of forming a redistribution portion over the first encapsulation layer.

The method couples (at 1120) at least one second discrete device and at least one pillar to the first redistribution portion (e.g., 202). A pick and place may be used to provide the first discrete device. The at least one pillar (e.g., 252) may be formed using a plating process. Examples of the first discrete device include a passive device (e.g., 216) and an integrated device (e.g., 211). The discrete devices may be formed over the first redistribution portion. The pillars may be formed over the first redistribution portion and the discrete devices. Stage 12 of FIG. 9D illustrates an example of providing a second discrete device and at least one pillar.

The method forms (at 1125) a second encapsulation layer (e.g., 250) over at least one discrete device (e.g., passive device 216, integrated device 211) and at least one pillar (e.g., 252). The first encapsulation layer may at least partially encapsulate the pillars, the integrated devices and/or the passive devices. The process of forming and/or disposing the first encapsulation layer (e.g., 250) may include using a compression and transfer molding process, a sheet molding process, or a liquid molding process. A grinding process may be used to remove a portion of the first encapsulation layer. Stage 13 of FIG. 9E illustrate an example of forming a second encapsulation layer. In some implementations, one or more cavities may be formed in the first encapsulation layer and/or the second encapsulation layer. At least one discrete device may be placed in one of the cavities. Another encapsulation layer may be formed over the discrete device in the cavities. Stages 14-16 of FIGS. 9E-9F illustrate an example of forming a cavity, placing a discrete device in the cavity, and forming an encapsulation layer.

The method forms (at 1130) a second redistribution portion (e.g., 204) over the second encapsulation layer (e.g., 250), the at least one discrete device and the pillars. Forming the second redistribution portion may include forming at least one dielectric layer (e.g., 240) and a plurality of redistribution interconnects (e.g., 242). Forming the plurality of redistribution interconnects 242 may include forming a seed layer, performing a lithography process, a plating process, a stripping process and/or an etching process. Forming a redistribution portion may include forming at least one redistribution layer. Stage 17 of FIG. 9G illustrates an example of forming a redistribution portion over the second encapsulation layer.

The method forms (at 1135) a third redistribution portion (e.g., 206) over the first encapsulation layer (e.g., 230), the at least one discrete device and the pillars. Forming the third redistribution portion may include forming at least one dielectric layer (e.g., 260) and a plurality of redistribution interconnects (e.g., 262). Forming the plurality of redistribution interconnects 262 may include forming a seed layer, performing a lithography process, a plating process, a stripping process and/or an etching process. Forming a redistribution portion may include forming at least one redistribution layer. Stage 20 of FIG. 9H may illustrate an example of forming a redistribution portion over the first encapsulation layer.

The method may optionally provide (at 1140) additional discrete device(s), pillars, form additional encapsulation layer(s), and/or form additional redistribution portion(s). Stages 21-23 of FIGS. 9I-9K may illustrate examples of providing additional discrete device(s), pillars, forming additional encapsulation layer(s), and/or forming additional redistribution portion(s).

Exemplary Electronic Devices

Figure 12:
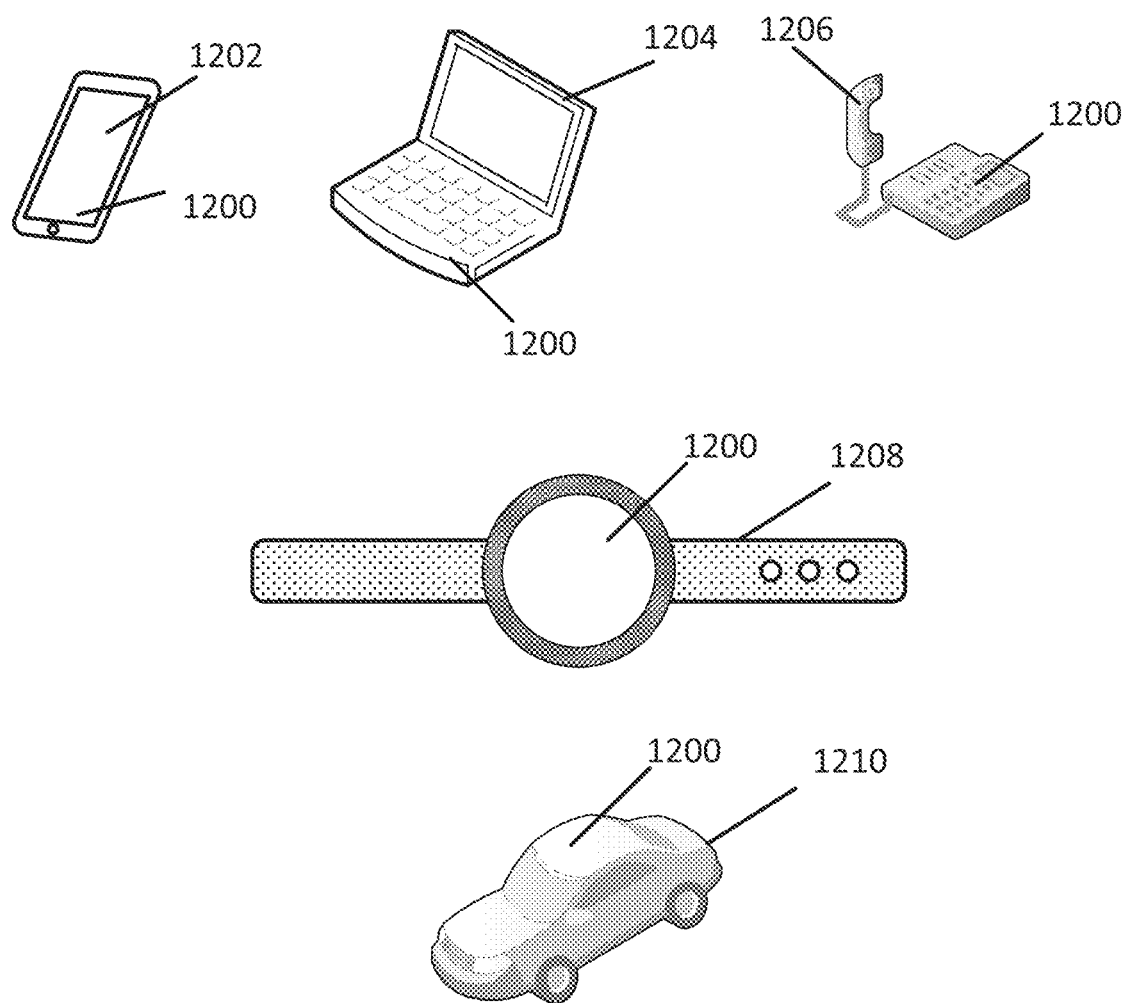
FIG. 12 illustrates various electronic devices that may integrate a die, an integrated device, an integrated passive device (IPD), a passive component, a package, and/or a device package described herein.

FIG. 12 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1202, a laptop computer device 1204, a fixed location terminal device 1206, a wearable device 1208, or automotive vehicle 1210 may include a device 1200 as described herein. The device 1200 may be, for example, any of the devices and/or integrated circuit (IC) packages described herein. The devices 1202,1204,1206 and 1208 and the vehicle 1210 illustrated in FIG. 12 are merely exemplary. Other electronic devices may also feature the device 1200 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-8, 9A-9M, 10A-10I, and/or 11-12 may be rearranged and/or combined into a single component, process, feature or function or embodied in several components, processes, or functions. Additional elements, components, processes, and/or functions may also be added without departing from the disclosure. It should also be noted FIGS. 2-8, 9A-9M, 10A-10I, and/or 11-12 and its corresponding description in the present disclosure is not limited to dies and/or ICs. In some implementations, FIGS. 2-8, 9A-9M, 10A-10I, and/or 11-12 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional. The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The term "encapsulating" means that the object may partially encapsulate or completely encapsulate another object. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a current (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

In the following further examples are described to facilitate the understanding of the invention.

One example provides a package that includes a first redistribution portion, a second redistribution portion, a third redistribution portion, a first encapsulation layer coupled to the first redistribution portion and the third redistribution portion, a first discrete device encapsulated by the first encapsulation layer, wherein the first discrete device is located between the first redistribution portion and the third redistribution portion, a second encapsulation layer coupled to the first redistribution portion and the second redistribution portion, and a second discrete device encapsulated by the second encapsulation layer, wherein the second discrete device is located between the first redistribution portion and the second redistribution portion. The package may further include a third discrete device located at least laterally to the first redistribution portion, wherein the third discrete device may be located between the second redistribution portion and the third redistribution portion. Further, the third discrete device may be encapsulated by at least the first encapsulation layer and/or the second encapsulation layer. The package may further include a fourth redistribution portion, a third encapsulation layer coupled to the third redistribution portion and the fourth redistribution portion and a third discrete device encapsulated by the third encapsulation layer, wherein the third discrete device may be located between the third redistribution portion and the fourth redistribution portion. Further, the package may include a fourth discrete device located at least laterally to the first redistribution portion, wherein the fourth discrete device may be located between the second redistribution portion and the third redistribution portion. Further, the first redistribution portion may include at least one first dielectric layer and a first plurality of redistribution interconnects, wherein the second redistribution portion may comprise at least one second dielectric layer and a second plurality of redistribution interconnects, wherein the third redistribution portion may include at least one third dielectric layer and a third plurality of redistribution interconnects and wherein the fourth redistribution portion may comprise at least one fourth dielectric layer and a fourth plurality of redistribution interconnects. The package, wherein at least one redistribution interconnect from the first plurality of redistribution interconnects, the second plurality of redistribution interconnects, the third plurality of redistribution interconnects, and/or the fourth plurality of redistribution interconnects may include a thickness of approximately 5-10 micrometers (μm). The package, wherein at least one redistribution interconnects from the first plurality of redistribution interconnects, the second plurality of redistribution interconnects, the third plurality of redistribution interconnects, and/or the fourth plurality of redistribution interconnects may include a U-shape interconnect and/or V-shape interconnect. The package, wherein the first discrete device may include a first integrated device or a first passive device, and wherein the second discrete device may include a second integrated device or a second passive device. Further, the package may be a first package from a package on package (PoP).

Another example provides an apparatus that includes means for first redistribution, means for second redistribution, means for third redistribution, means for first encapsulation coupled to the means for first redistribution and the means for third redistribution, a first discrete device encapsulated by the means for first encapsulation, wherein the first discrete device is located between the means for first redistribution and the means for third redistribution, means for second encapsulation coupled to the means for first redistribution and the means for second redistribution, and a second discrete device encapsulated by the means for second encapsulation, wherein the second discrete device is located between the means for first redistribution and the means for second redistribution.

Another example provides a method for fabricating a package. The method provides a first discrete device. The method forms a first encapsulation layer over the first discrete device. The method forms a first redistribution portion over a first side of the first encapsulation layer. The method couples a second discrete device to the first redistribution portion. The method forms a second encapsulation layer over the second discrete device. The method forms a second redistribution portion over the second encapsulation layer. The method forms a third redistribution portion over a second side of the first encapsulation layer.

What is claimed is:

1. A package comprising:
   a first redistribution portion;
   a second redistribution portion;
   a third redistribution portion;
   a first encapsulation layer coupled to the first redistribution portion and the third redistribution portion;
   a first discrete device encapsulated by the first encapsulation layer, wherein the first discrete device is located between the first redistribution portion and the third redistribution portion;
   a second encapsulation layer coupled to the first redistribution portion and the second redistribution portion;
   a second discrete device encapsulated by the second encapsulation layer, wherein the second discrete device is located between the first redistribution portion and the second redistribution portion; and
   a third discrete device located at least laterally to the first redistribution portion, wherein the third discrete device is further located between the second redistribution portion and the third redistribution portion.

2. The package of claim 1, wherein the third discrete device is further located at least laterally to the first discrete device and/or the second discrete device.

3. The package of claim 1, wherein the third discrete device is encapsulated by at least the first encapsulation layer, the second encapsulation layer and/or a third encapsulation layer.

4. The package of claim 1, further comprising:
   a fourth redistribution portion;
   a third encapsulation layer coupled to the third redistribution portion and the fourth redistribution portion; and
   a fourth discrete device encapsulated by the third encapsulation layer, wherein the fourth discrete device is located between the third redistribution portion and the fourth redistribution portion.

5. The package of claim 4,
   wherein the package is configured to be coupled to a board such that (i) the fourth redistribution portion is a redistribution portion from the package that is closest to the board, and (ii) the second redistribution portion is a redistribution portion from the package that is farthest from the board, wherein the second discrete device is a first integrated device comprising a first front side and a first back side,
wherein the first integrated device is coupled to the first redistribution portion such that the first back side faces the first redistribution portion,
wherein the fourth discrete device is a second integrated device comprising a second front side and a second back side, and
wherein the second integrated device is coupled to the third redistribution portion such that the second back side faces the third redistribution portion and the second front side faces the fourth redistribution portion.

6. The package of claim 4,
wherein the first redistribution portion comprises:
   at least one first dielectric layer; and
   a first plurality of redistribution interconnects,
wherein the second redistribution portion comprises:
   at least one second dielectric layer; and
   a second plurality of redistribution interconnects,
wherein the third redistribution portion comprises:
   at least one third dielectric layer; and
   a third plurality of redistribution interconnects, and
wherein the fourth redistribution portion comprises:
   at least one fourth dielectric layer; and
   a fourth plurality of redistribution interconnects.

7. The package of claim 6, wherein at least one redistribution interconnect from the first plurality of redistribution interconnects, the second plurality of redistribution interconnects, the third plurality of redistribution interconnects, and/or the fourth plurality of redistribution interconnects comprises a thickness of approximately 5-10 micrometers (μm).

8. The package of claim 6, wherein at least one redistribution interconnects from the first plurality of redistribution interconnects, the second plurality of redistribution interconnects, the third plurality of redistribution interconnects, and/or the fourth plurality of redistribution interconnects comprises a U-shape interconnect and/or V-shape interconnect.

9. The package of claim 1,
wherein the first discrete device includes a first integrated device or a first passive device, and
wherein the second discrete device includes a second integrated device or a second passive device.

10. The package of claim 1, wherein the package is a first package from a package on package (PoP).

11. The package of claim 1, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

12. The package of claim 1, further comprising a third encapsulation layer located between the second redistribution portion and the third redistribution portion,
wherein the third encapsulation layer at least partially encapsulates the third discrete device,
wherein the third encapsulation layer is at least coupled to the second redistribution portion, and
wherein the third discrete device is coupled to the third redistribution portion.

13. The package of claim 12, wherein the first encapsulation layer, the second encapsulation layer and/or the third encapsulation layer are part of a same encapsulation layer.

14. An apparatus comprising:
means for first redistribution;
means for second redistribution;
means for third redistribution;
means for first encapsulation coupled to the means for first redistribution and the means for third redistribution;
a first discrete device encapsulated by the means for first encapsulation, wherein the first discrete device is located between the means for first redistribution and the means for third redistribution;
means for second encapsulation coupled to the means for first redistribution and the means for second redistribution;
a second discrete device encapsulated by the means for second encapsulation, wherein the second discrete device is located between the means for first redistribution and the means for second redistribution; and
a third discrete device located at least laterally to the means for first redistribution,
wherein the third discrete device is further located at least laterally to the second discrete device, and
wherein the third discrete device is further located between the means for second redistribution and the means for third redistribution.

15. The apparatus of claim 14, wherein the third discrete device is further located at least laterally to the first discrete device.

16. The apparatus of claim 14, wherein the third discrete device is encapsulated by at least the means for first encapsulation the means for second encapsulation and/or a means for third encapsulation.

17. The apparatus of claim 14, further comprising:
means for fourth redistribution;
means for third encapsulation coupled to the means for third redistribution and the means for fourth redistribution; and
a fourth discrete device encapsulated by the means for third encapsulation, wherein
the fourth discrete device is located between the means for third redistribution and the means for fourth redistribution.

18. The apparatus of claim 17, further comprising:
a board; and
a package coupled to the board,
wherein the package comprises the means for first redistribution, the means for second redistribution, the means for third redistribution, the means for fourth redistribution, the means for first encapsulation, the means for second encapsulation, the means for third encapsulation, the first discrete device, the second discrete device, the third discrete device, and the fourth discrete device,
wherein the package is configured to be coupled to the board such that (i) the means for fourth redistribution is a means for redistribution from the package that is closest to the board, and (ii) the means for second redistribution is a means for redistribution from the package that is farthest from the board,
wherein the second discrete device is a first integrated device comprising a first front side and a first back side,
wherein the first integrated device is coupled to the means for first redistribution through a first adhesive such that the first back side faces the means for first redistribution, wherein the fourth discrete device is a second integrated device comprising a second front side and a second back side, and wherein the second integrated device is coupled to the means for third redistribution through a second adhesive such that the second back side faces the means for third redistribution and the second front side faces the means for fourth redistribution.

19. The apparatus of claim 17, wherein the means for first redistribution comprises a first plurality of redistribution interconnects, wherein the means for second redistribution comprises a second plurality of redistribution interconnects, wherein the means for third redistribution comprises a third plurality of redistribution interconnects, and wherein the means for fourth redistribution comprises a fourth plurality of redistribution interconnects.

20. The apparatus of claim 19, wherein at least one redistribution interconnects from the first plurality of redistribution interconnects, the second plurality of redistribution interconnects, the third plurality of redistribution interconnects, and/or the fourth plurality of redistribution interconnects comprises a U-shape interconnect and/or V-shape interconnect.

21. The apparatus of claim 14, wherein the first discrete device includes a first integrated device or a first passive device, and wherein the second discrete device includes a second integrated device or a second passive device.

22. The apparatus of claim 14, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

* * * * *